(12) United States Patent
Tsuji et al.

(10) Patent No.: US 7,089,073 B2
(45) Date of Patent: Aug. 8, 2006

(54) COMPONENT MOUNTING APPARATUS AND COMPONENT MOUNTING METHOD, AND RECOGNITION APPARATUS FOR A COMPONENT MOUNT PANEL, COMPONENT MOUNTING APPARATUS FOR A LIQUID CRYSTAL PANEL, AND COMPONENT MOUNTING METHOD FOR A LIQUID CRYSTAL PANEL

(75) Inventors: Shinjiro Tsuji, Nara (JP); Tomotaka Nishimoto, Hirakata (JP); Takahiko Murata, Kyoto (JP); Masayuki Ida, Moriguchi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 292 days.

(21) Appl. No.: 10/203,661

(22) PCT Filed: Feb. 15, 2001

(86) PCT No.: PCT/JP01/01062

§ 371 (c)(1),
(2), (4) Date: Aug. 12, 2002

(87) PCT Pub. No.: WO01/62062

PCT Pub. Date: Aug. 23, 2001

(65) Prior Publication Data

US 2003/0033034 A1    Feb. 13, 2003

(30) Foreign Application Priority Data

Feb. 17, 2000  (JP)  ............................... 2000-39160
Feb. 23, 2000  (JP)  ............................... 2000-45837

(51) Int. Cl.
*G06F 19/00*    (2006.01)

(52) U.S. Cl. .................................................... 700/114

(58) Field of Classification Search .......... 700/56–64, 700/112–114, 117–121
See application file for complete search history.

(56) References Cited

U.S. PATENT DOCUMENTS 5,004,399 A    4/1991   Sullivan et al. ............. 414/729

(Continued)

FOREIGN PATENT DOCUMENTS

EP    0-734-056    9/1996
JP    04-352442    12/1992

(Continued)

OTHER PUBLICATIONS

"*General-Purpose, High-Force, Vacuum Fixture for the Printed Circuit Card Fabrication Industry*", IBM Technical Disclosure Bulletin, US, IBM Corp. New York, vol. 35, No. 1A, Jun. 1, 1992, pp. 215-216.

*Primary Examiner*—Maria N. Von Buhr
(74) *Attorney, Agent, or Firm*—Wenderoth, Lind & Ponack, L.L.P.

(57) ABSTRACT

Transfer of liquid crystal panels to subsequent processes is performed with the panels placed on transfer arms and held by suction pads. A small suction force can be sufficient, and a suction irregularity is prevented. The transfer arms are arranged at a lower side of the liquid crystal panels, thus not obstructing the liquid crystal panels. In arranging the liquid crystal panels at an image pickup device, a panel holding device is controlled to be driven so as to position panel marks to a bonding height position while negating a deflection amount of the liquid crystal panels, and furthermore a component holding device is controlled to be driven so as to position component marks to the bonding height position and to mount electronic components to the liquid crystal panels at the bonding height position.

18 Claims, 16 Drawing Sheets

U.S. PATENT DOCUMENTS

| | | | | |
|---|---|---|---|---|
| 5,501,005 | A | | 3/1996 | Onitsuka .................... 29/833 |
| 5,509,771 | A | | 4/1996 | Hiroki ........................ 414/217 |
| 5,639,009 | A | | 6/1997 | Abe ........................... 228/102 |
| 5,677,749 | A | * | 10/1997 | Tsubota et al. ............. 349/160 |
| 5,764,013 | A | | 6/1998 | Yae ....................... 318/568.11 |
| 5,765,889 | A | | 6/1998 | Nam et al. ................. 294/64.1 |
| 5,864,944 | A | * | 2/1999 | Kashiwagi et al. ........... 29/833 |
| 5,867,897 | A | * | 2/1999 | Mimura et al. ............... 29/840 |
| 5,879,040 | A | | 3/1999 | Nagai et al. .................. 294/65 |
| 5,923,408 | A | * | 7/1999 | Takabayashi ................ 355/53 |
| 5,963,449 | A | | 10/1999 | Ota et al. .................... 700/112 |
| 5,984,293 | A | * | 11/1999 | Abrahamson et al. ...... 269/266 |
| 6,012,509 | A | * | 1/2000 | Nonaka ..................... 165/80.2 |
| 6,036,568 | A | * | 3/2000 | Murouchi et al. ............ 445/25 |
| 6,101,709 | A | | 8/2000 | Shiota ........................ 29/833 |
| 6,152,677 | A | * | 11/2000 | Tateyama et al. ........... 414/738 |
| 6,176,007 | B1 | * | 1/2001 | Kashiwagi et al. ........... 29/729 |
| 6,257,564 | B1 | * | 7/2001 | Avneri et al. ................. 269/21 |
| 6,304,311 | B1 | * | 10/2001 | Egami et al. ................ 349/189 |
| 6,339,321 | B1 | | 1/2002 | Yamashita et al. ....... 324/158.1 |
| 6,446,948 | B1 | * | 9/2002 | Allen .......................... 269/21 |
| 6,507,997 | B1 | * | 1/2003 | Kawai et al. ................. 29/833 |
| 6,535,291 | B1 | * | 3/2003 | Skunes et al. .............. 356/614 |
| 6,559,928 | B1 | * | 5/2003 | Aoki ........................... 355/72 |
| 6,611,249 | B1 | * | 8/2003 | Evanicky et al. ........... 345/102 |
| 6,621,551 | B1 | * | 9/2003 | Matsuzawa .................. 349/187 |
| 6,631,552 | B1 | * | 10/2003 | Yamaguchi .................. 29/739 |
| 6,664,549 | B1 | * | 12/2003 | Kobayashi et al. .... 250/440.11 |
| 6,665,043 | B1 | * | 12/2003 | Okuyama et al. ........... 349/187 |
| 6,708,402 | B1 | * | 3/2004 | Hirano et al. ................. 29/833 |
| 6,718,608 | B1 | * | 4/2004 | Wah et al. .................. 29/401.1 |
| 6,744,499 | B1 | * | 6/2004 | Skunes et al. ........... 356/243.1 |
| 6,762,826 | B1 | * | 7/2004 | Tsukamoto et al. ........... 355/72 |
| 6,836,316 | B1 | * | 12/2004 | Tokita ......................... 355/72 |
| 6,860,801 | B1 | * | 3/2005 | Yang et al. ................. 451/388 |

FOREIGN PATENT DOCUMENTS

| | | | |
|---|---|---|---|
| JP | 07-088730 | | 4/1995 |
| JP | 09-219357 | | 8/1997 |
| JP | 11-188669 | | 7/1999 |
| JP | JP 2001-210999 | * | 8/2001 |
| KR | 1999-23439 | | 3/1999 |
| KR | 1999-88676 | | 12/1999 |
| KR | 10-0237662 | | 1/2000 |

* cited by examiner

COMPONENT MOUNTING APPARATUS AND COMPONENT MOUNTING METHOD, AND RECOGNITION APPARATUS FOR A COMPONENT MOUNT PANEL, COMPONENT MOUNTING APPARATUS FOR A LIQUID CRYSTAL PANEL, AND COMPONENT MOUNTING METHOD FOR A LIQUID CRYSTAL PANEL

TECHNICAL FIELD

The present invention relates to a component mounting apparatus and a component mounting method with a transfer mechanism for mounting a component onto a liquid crystal panel or the like. Further, the present invention relates to: a recognition apparatus for a component mount panel for picking up and then recognizing images of both a panel, e.g., liquid crystal panel or the like, and an electronic component to be mounted thereon; a component mounting apparatus for a liquid crystal panel including the recognition apparatus; and a component mounting method for a liquid crystal panel performed by the component mounting apparatus for the liquid crystal panel.

BACKGROUND ART

There have conventionally been known electronic component mounting apparatuses for mounting electronic components to objects while transferring, with use of arms, the objects to which the electronic components are to be mounted. There is, for example, an electronic component mounting apparatus of a type which mounts TCPs (Tape Carrier Package) onto liquid crystal panels.

FIG. 19 is a perspective view of a conventional electronic component mounting apparatus of one example in its entirety. Electronic component mounting apparatus 51 shown in this figure is an apparatus for mounting TCPs onto liquid crystal panels, which includes an ACF attachment part 52, a TCP temporary pressure bonding part 53, and a TCP permanent pressure bonding part 54. Transfer arms 55 are set so as to transfer liquid crystal panels. A liquid crystal panel handed to a transfer arm from outside the apparatus is sequentially sent to an adjacent transfer arm after completely being processed at each of the parts 52–54, so that the liquid crystal panel is transferred in a direction of arrow "a".

A perspective view of FIG. 20 concretely illustrates how each transfer arm holds a liquid crystal panel. A suction pad (not shown) is formed on a disc part 55a of transfer arm 55. Liquid crystal panel 60 is held by the transfer arm 55 from above, i.e., from a side of a display face, through vacuum suction by the suction pad.

The liquid crystal panel 60 held in this state can be transferred in the direction of the arrow "a" (FIG. 19), in other words, can be transferred to an adjacent subsequent process. Concretely, the liquid crystal panel 60 completely finished at each part such as the ACF attachment part 52 or the like is transferred in a direction of arrow "b" by a panel stage 56 set below the liquid crystal panel 60, and is brought into a state of FIG. 20.

In this state, the liquid crystal panel 60 is delivered to the transfer arm 55 which in turn holds the liquid crystal panel 60 from above. The liquid crystal panel is then transferred in the arrow "a" direction. The liquid crystal panel 60 having an ACF attached thereto by the ACF attachment part 52 is transferred to a position opposite to the TCP temporary pressure bonding part 53, which is the next process.

However, the conventional electronic component mounting apparatus as above has problems as follows. Liquid crystal panels have been increasingly made large and thin these days; thus making it necessary to increase a hold force of the transfer arm 55, namely, a vacuum suction force of a corresponding suction pad. This increase of the hold force brings about an irregularity (shaded parts c) in suction by the suction pad at a periphery of the suction pad, and this suction irregularity leads to a display irregularity in highly fine and high-quality liquid crystal panels, thereby lowering an image quality.

Liquid crystal panels must be removed from the apparatus in case of maintenance. However, the transfer arms 55 above the liquid crystal panels make it impossible to remove the liquid crystal panels even when the conventional electronic component mounting apparatus as above comes to a halt because of a failure or the like, or require complicated work even if it is possible.

The present invention is devised to solve the problems inherent in this prior art, and has for its first object to provide an electronic component mounting apparatus which can prevent damage to objects, to which electronic components are to be mounted, by holding the objects from below when transferring the objects, with a maintainability improved.

The above-described conventional component mounting apparatus still includes problems as below. That is, there is a liquid crystal panel 71, for instance, having a liquid crystal display part 74 set to a surface of a glass plate 73 as shown in FIG. 22. An electronic component 72 for operating the liquid crystal display part 74 is mounted at a periphery of the liquid crystal display part 74, more specifically, to a side edge part 73a of the glass plate 73. For mounting the electronic component 72 to a component mount position of the side edge part 73a, as indicated in FIG. 23, an image of a panel mark on the side edge part 73a is picked up and recognized by a camera 75, while an image of a component mark on the electronic component 72 is picked up and recognized by, e.g., the same camera 75. On a basis of these recognition results of the panel mark and component mark, a location of the liquid crystal panel 71 is corrected with a panel hold device 76 which holds the liquid crystal panel 71 and corresponds to a panel stage, which correction is achieved by moving the panel 71 in X and Y directions and moreover rotating the panel 71 about an axis of a shaft 77 of the panel hold device 76. At the same time, the electronic component 72 is rotated about an axis of a component hold member 78 holding the electronic component 72, thereby resulting in the component being corrected in terms of position. The electronic component 72 is mounted to a specific component mount position in this manner.

As shown in FIG. 23, conventionally, the liquid crystal panel 71 is held at its nearly central part by a hold part 79 of the panel hold device 76. Since the panel hold device 76 is movable in the X and Y directions as mentioned above, the hold part 79 is limited in size in order to avoid interference with other devices.

Under these circumstances, while liquid crystal panels of a several-cm square used in, for example, mobile phones or the like are accompanied with no problem, in the liquid crystal panel 71 having the glass plate 73 of a large size not smaller than 10 inches, e.g., 15 inches or 21 inches, a large amount of deflection at a component mount position has arisen when this large size panel 71 is held by the hold part 79 as shown in FIG. 24. Therefore, an error corresponding to this deflection amount is generated between when an image of the liquid crystal panel 71 is picked up by the camera 75 and when the electronic component 72 is mounted to the liquid crystal panel 71. Accordingly, in the liquid crystal panel 71 of such a large size, the deflection amount consequently affects positional correction of the liquid crystal panel 71 as above, thereby making it difficult to mount the electronic component 72 to a specified component mount position.

In addition, since latest liquid crystal panels 71 have been made thinner and lighter in weight, a deflection amount of liquid crystal panels 71 is apt to increase as well as in consequence of the above size increase, as shown in FIG. 25. A deflection amount is hence considered to further hinder the electronic component 72 from being mounted to a specified component mount position. The deflection amount indicated in FIG. 25 is a dimension between an uppermost end and a lowest end of a deflected liquid crystal panel.

SUMMARY OF THE INVENTION

The present invention is devised to solve the aforementioned problem and has for its second object to provide a recognition apparatus for a component mount panel, a component mounting apparatus for a liquid crystal panel, and a component mounting method for a liquid crystal panel for being able to mount components to specified component mount positions even if panels are deflected.

In order to accomplish the above first object, the present invention is constituted as follows.

According to a component mounting apparatus of a first aspect of the present invention, there is provided a component mounting apparatus for mounting components to objects through a plurality of processes, which comprises:

transfer devices for transferring each of the objects between the processes, each of the transfer devices having transfer arms with suction devices on which each of the objects is loaded and at the same time held by the suction devices, when each of the objects is transferred between the processes.

According to the component mounting apparatus as above, each object is transferred while held from its lower side. Therefore, a suction force for this holding can be small as compared with a case where an object is held at its upper side, whereby suction irregularity due to action of the suction force is prevented. Since the transfer device is placed at the lower side of the object, there is no particular obstruction to removing the object from the apparatus. Even if the apparatus stops due to a failure or the like, work required for removing the object from the apparatus is facilitated and superior maintainability is realized.

In the above component mounting apparatus, preferably the transfer devices are arranged at positions opposite to working areas for performing the processes respectively, and transfer the objects completely processed at the working areas to positions opposite to subsequent working areas after the objects are delivered to the transfer devices.

The component mounting apparatus preferably includes movement devices for supporting the objects at their lower sides and moving the objects at least in an up-and-down and back-and-forth directions, and delivering the objects completely processed at the working areas to the transfer devices.

Preferably, each of the movement devices raises each of the objects loaded on the transfer arms up from the transfer arms and transfers these objects to the working areas of processes, transfers the objects to a higher position than that of the transfer arms after being completely processed at the working areas, and lowers the objects and places the objects again on the transfer arms.

Further, each of the transfer devices may have two transfer arms for supporting an object at both end parts thereof. According to the above component mounting apparatus, suction irregularity at a central part of the object can be perfectly prevented.

Further, the suction devices may hold the object by vacuum suction. According to the above component mounting apparatus, holding is made sure.

Further, each of the suction devices may have pad parts, formed of a buffering material with upper end faces positioned higher than a surface of the transfer arms, for sucking an object. According to the component mounting apparatus, sure suction is ensured even when a flatness of the transfer arms and the objects varies.

Further, the object may be a flat display panel.

According to a second aspect of the present invention, there is provided a component mounting method for mounting components to objects through a plurality of processes, the method comprising:

holding lower sides of each of the objects; and transferring these held objects between the processes.

According to the above component mounting method, since each object is held at its lower side, a suction force for holding the object can be smaller, because of a weight of the object, than when the object is held at its upper side; thus preventing a suction irregularity by action of a suction force. Since transfer devices are set to the lower side of the objects, there is no hinderance when objects are to be removed from the apparatus. Removing objects from the apparatus is facilitated even if the apparatus stops by a failure or the like, and a superior maintainability is realized.

In the above method, transfer may be performed with use of transfer devices having transfer arms with suction devices in a state while an object is placed on the transfer arms and at the same time held by the suction devices.

Also preferably, an object loaded on the transfer arms is raised up, thereby being separated from the transfer arms, then transferred to a working area of one of the processes, transferred to a higher position than that of the transfer arms after being completely processed at the working area of the process, then lowered and placed again onto the transfer arms.

In order to accomplish the above second object, a recognition apparatus for a component mount panel is provided according to a third aspect of the present invention, which comprises:

an image pickup device for picking up images of panel marks on a panel to which a component is to be mounted, in a state while the panel marks are arranged at a bonding height position in a thickness-direction of the panel when the component is to be mounted onto the panel;

a panel holding device for holding and moving the panel to arrange the panel at the image pickup device for image pickup; and a control device for controlling movement of the panel hold device so as to position the panel marks to the bonding height position while negating a deflection amount of the panel generated as a result of being held by the panel hold device when the panel is to be arranged at the image pickup device.

The image pickup device may comprise a light-passing stage onto which the panel is loaded to arrange the panel marks at the bonding height position when images the panel marks are to be picked up, and cameras disposed opposite to the panel via the stage for picking up the images of the panel marks through the stage.

Further, the panel marks are set by two, and the cameras may have a fixed camera for picking up an image of one of the panel marks and a movable camera for picking up an image of the other panel mark, which movable camera is movable to conform to an interval between the other panel mark and the one of the panel marks.

A component mounting apparatus for a liquid crystal panel provided according to a fourth aspect of the present invention, comprises:

an image pickup device for picking up images of panel marks on a panel to which a component is to be mounted, in a state while the panel marks are arranged at a bonding height position in a thickness-direction of the panel when the component is to be mounted to the panel, and moreover picking up images of component marks on the component in a state while the component marks are arranged at the bonding height position;

a panel holding device for holding and moving the liquid crystal panel to arrange the liquid crystal panel at the image pickup device for image pickup;

a component hold device for holding and moving the component so as to arrange the component marks of the component at the bonding height position by the image pickup device for image pickup, and moreover mounting this held component to the liquid crystal panel at the bonding height position; and a control device for controlling the panel hold device to arrange the panel marks at the bonding height position while negating a deflection amount of the liquid crystal panel generated because of being held by the panel hold device when the liquid crystal panel is to be arranged at the image pickup device.

In the component mounting apparatus for a liquid crystal panel according to the above fourth aspect, the image pickup device may have a light-passing stage onto which the panel is loaded to arrange the panel marks at the bonding height position when images of the panel marks are to be picked up, and which becomes a support stage in mounting of the component to the liquid crystal panel, and cameras disposed opposite to the panel and the component via the stage for picking up images of the panel marks and the component marks through the stage.

In the component mounting apparatus for a liquid crystal panel of the fourth aspect, the panel marks and the component marks are set each by two, and the cameras may have a fixed camera for picking up images of either ones of the panel marks and component marks, and a movable camera for picking up images of the other ones of the panel marks and component marks, which movable camera is movable to conform to an interval between the other mark and the one mark of the panel marks and component marks.

In the component mounting apparatus for a liquid crystal panel of the fourth aspect, the deflection amount is a value set for each side of the liquid crystal panel, so that the control device may control the panel holding device on a basis of the value set for the side where the panel marks to be recognized are present.

In the component mounting apparatus for a liquid crystal panel according to the fourth aspect, the deflection amount is a value set at a mount portion for the component, so that the control device may control the panel hold device on a basis of the value set at the mount portion for the component.

The component mounting apparatus for a liquid crystal panel according to the fourth aspect may further include a deflection detection device for detecting a deflection amount of a mount portion, for the component, of the liquid crystal panel before the liquid crystal panel is disposed to the image pickup device, so that the control device controls the panel holding device on a basis of the deflection amount as supplied from the deflection detection device.

According to a component mounting method for a liquid crystal panel of a fifth aspect of the present invention, the method comprises:

holding a liquid crystal panel onto which a component is to be mounted;

loading the liquid crystal panel onto a light-passing stage, as a support stage, in a state where a deflection of the liquid crystal panel generated by this holding is eliminated; and mounting the component onto the liquid crystal panel loaded onto the stage.

According to the recognition apparatus for a component mount panel in the third aspect of the present invention as described hereinabove, the control device controls the panel hold device to negate the deflection amount of the panel generated when held by the panel holding device, and to position the panel marks to the bonding height position when the panel is arranged at the image pickup device. Since the panel is in a state free from deflection when images of the panel marks are picked up, the images of the panel marks can be picked up with higher accuracy than is conventional.

According to the component mounting apparatus for a liquid crystal panel in accordance with the fourth aspect and the component mounting method for a liquid crystal panel in accordance with the fifth aspect of the present invention, there are arranged the image pickup device, the panel holding device, the component holding device, and the control device. The control device controls operation of the panel holding device so as to negate the deflection amount of the liquid crystal panel generated when held by the panel holding device, and to position the panel marks to the component bonding height position when the liquid crystal panel is arranged at the image pickup device, and moreover, the control device makes the component holding device mount components onto the liquid crystal panel at the bonding height position with the component marks positioned at the bonding height position. Accordingly, the images of the panel marks can be picked up in a state without any deflection of the liquid crystal panel. Moreover, a position where the images of the panel marks and the component marks are picked up are made equal to a position where the component is to be mounted to the liquid crystal panel. Thus, unnecessary operations for moving the panel holding device and the component holding device are reduced, so that accuracy for mounting components can be improved as compared with the prior art.

BRIEF DESCRIPTION OF DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
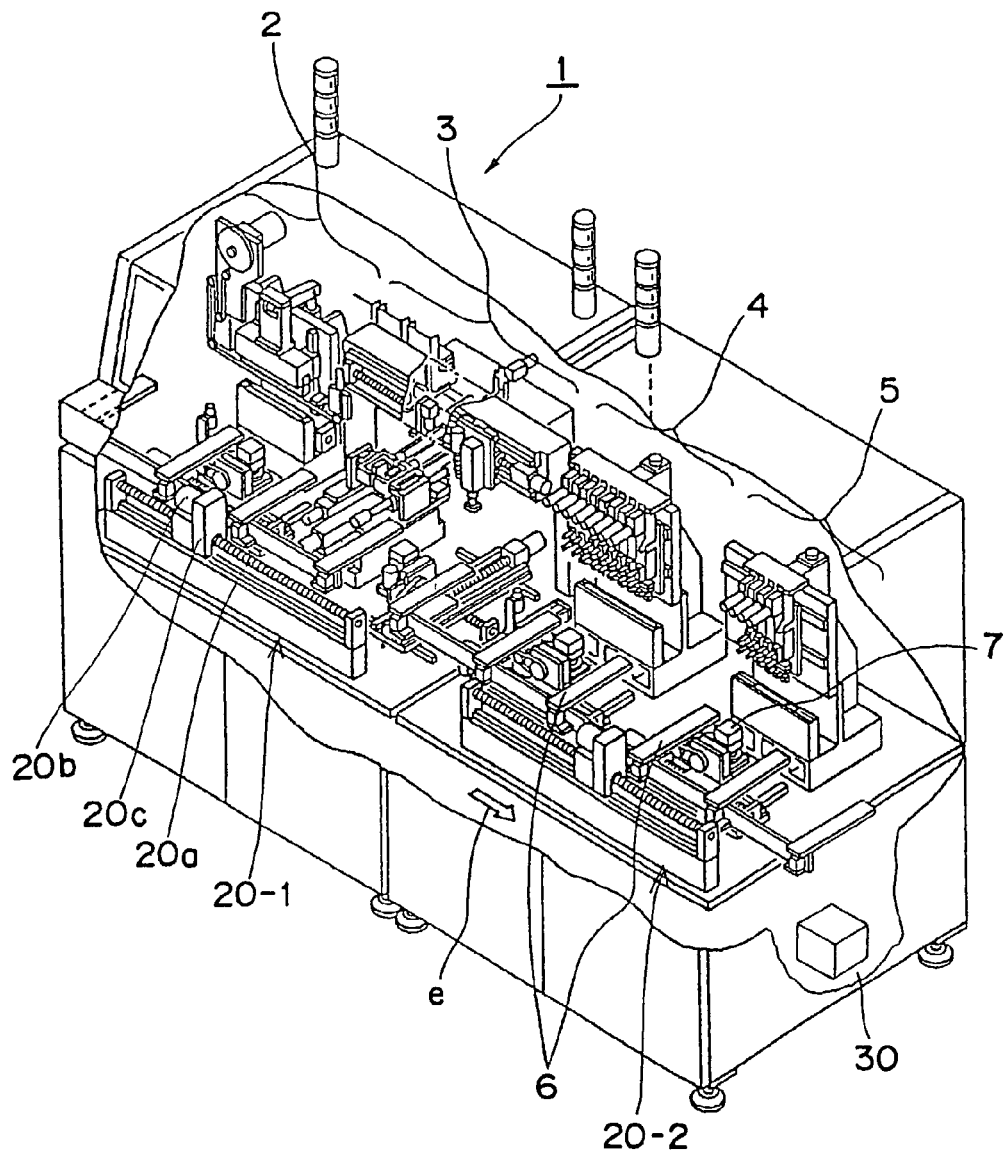
FIG. 1 is a perspective view showing a component mounting apparatus in its entirety according to a first embodiment of the present invention.

These and other objects and features of the present invention will become clear from the following description taken in conjunction with the preferred embodiments thereof with reference to the accompanying drawings, in which like parts are designated by like reference numerals.

A first embodiment of the present invention will be detailed hereinbelow with reference to the drawings.

FIG. 1 is a perspective view of an entire electronic component mounting apparatus according to a first embodiment of the present invention. Electronic component mounting apparatus 1 shown in FIG. 1 is an apparatus for mounting ICs (or TCPs) onto a liquid crystal panel. The embodiment exemplifies ICs as components to be mounted.

The electronic component mounting apparatus 1 includes an ACF attachment part 2, an IC temporary pressure bonding part 3, an IC permanent pressure bonding part 4, and an IC permanent pressure bonding part 5. The ACF attachment part 2 performs a process of affixing an ACF (Anisotropic Conductive Film) to a liquid crystal panel. The IC temporary pressure bonding part 3 performs a process of temporarily joining ICs to the liquid crystal panel, in which marks set to the liquid crystal panel and to the ICs are recognized to register the ICs and the liquid crystal panel. The IC permanent pressure bonding parts 4 and 5 perform a process of permanent joining the ICs to the liquid crystal panel while heating and pressing each of ICs with use of a press head. As above, the electronic component mounting apparatus 1 mounts each IC to the liquid crystal panel through a plurality of processes, i.e., an attachment process for ACF, a subsequent temporary pressure bonding process for ICs, and a subsequent permanent pressure bonding process for ICs. Each operation performed by the electronic component mounting apparatus 1 is controlled by a control device 30.

The operation for each process as above is conducted in a state with the liquid crystal panel transferred to a working position corresponding to each process of the above parts 2–5 constituting the apparatus. Transfer of the liquid crystal panel within each process is performed in a state while a lower side of the liquid crystal panel, namely, a non display side is held on a panel stage 7 and, the panel stage 7 is moved in up-down directions parallel to a thickness-direction of the liquid crystal panel, and in back-and-forth directions orthogonal to both the thickness-direction and a longitudinal direction to be described below. In contrast, transfer between processes, that is, transfer to each subsequent process is performed by moving the liquid crystal panel held on transfer arms 6 in the longitudinal direction of the apparatus.

Figure 2:
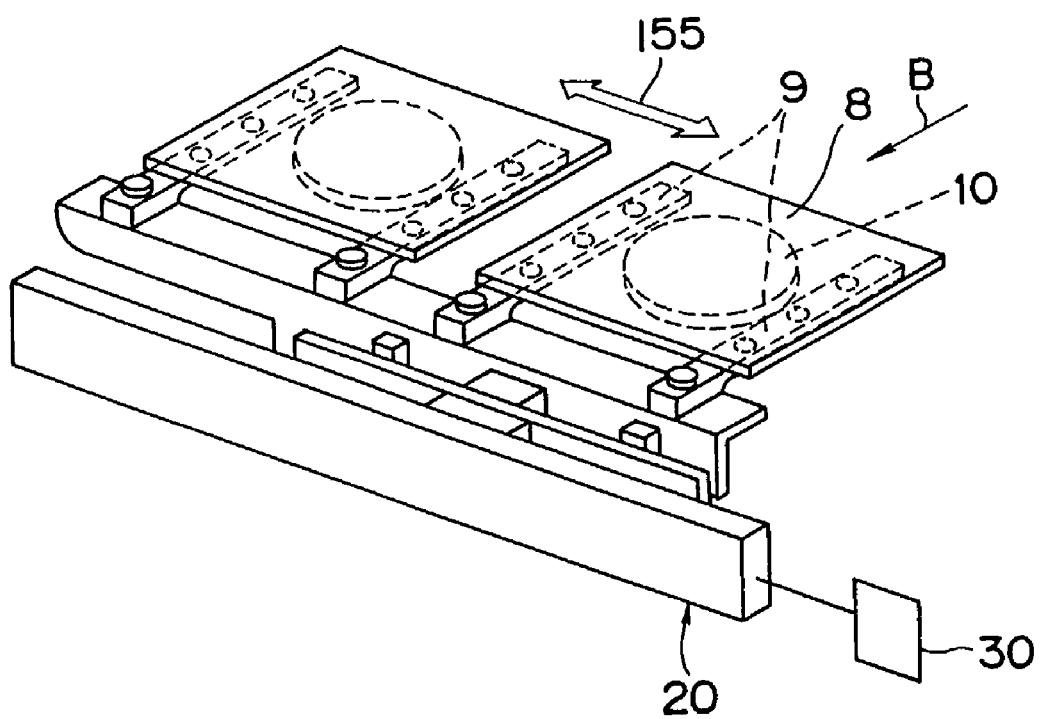
FIG. 2 is a perspective view for explaining a transfer method for liquid crystal panels in the first embodiment.

The transfer between processes will be described in detail with reference to FIGS. 2–5. FIG. 2 is a perspective view concretely showing a method for transferring the liquid crystal panel between processes in the present embodiment. FIG. 2 shows a part of the transfer arms 6 in FIG. 1. Since the transfer arms 6 in FIG. 1 are schematically illustrated and shapes in each of portions shown in FIGS. 1 and 2 are not necessarily identical, a fresh reference numeral will be allotted to explain this method.

Each of liquid crystal panels 8 is placed on two transfer arms 9 arranged parallel to each other in the embodiment. Therefore, each liquid crystal panel 8 is supported at both end parts at a side of a non display face. Although detailed later, each liquid crystal panel 8 is held on the transfer arms 9 by suction devices formed with the transfer arms 9. Each transfer arm 9 can be moved in an arrow direction (right-left direction) in FIG. 2 by a driving device 20 controlled in operation by the control device 30. The transfer arms 9 with the driving device 20 and, the control device 30 constitute an example of a transfer device.

The driving device 20 has, for example, a ball screw mechanism in the embodiment as shown in FIG. 1, which is provided with a screw 20a, a motor 20b as a driving source and, a nut part 20c which engages with the screw 20a, is moved in a direction of arrow 155 along the screw 20a by driving the motor 20b and has the transfer arms 9 set thereto. As illustrated, the driving device 20 includes a driving device 20-1 of a temporary bonding side set corresponding to the ACF attachment part 2 and the IC temporary pressure bonding part 3, and a driving device 20-2 of a permanent bonding side set corresponding to the IC permanent pressure bonding parts 4 and 5. The driving device 20-1 of the temporary bonding side has two pairs of the transfer arms 9 as indicated in the drawing when two transfer arms 9 are paired. On the other hand, the driving device 20-2 at the permanent bonding side has three pairs of transfer arms 9. One pair of these transfer arms present closest to the driving device 20-1 at the temporary bonding side, from among the three pairs, is constituted to be movable between the IC temporary pressure bonding part 3 and the IC permanent pressure bonding part 4. The driving device 20-1 at the temporary bonding side and the driving device 20-2 at the permanent bonding side are controlled by the control device 30 to operate so as not to interfere with each other.

Although the transfer arms 9 of each pair are disposed mutually parallel in the embodiment as described hereinabove, a layout is not limited to such parallel arrangement so long as the transfer arms 9 do not interfere with a panel stage 10 to be described later.

According to the above constitution, the liquid crystal panel 8 can be transferred in a direction of arrow "e" (FIG. 1) while being held on the transfer arms 9. Namely, in this holding state, the liquid crystal panel 8 is transferred to an adjacent subsequent process.

When the liquid crystal panel 8 is held at its lower side as described above, a weight of the liquid crystal panel 8 is applied onto the transfer arms 9, and consequently a suction force for holding the panel 8 can be made smaller than when the liquid crystal panel is held at its upper side. A suction irregularity resulting from action of the suction force is prevented accordingly. Especially when the liquid crystal panel 8 is held at both end parts thereof as in the present embodiment, the suction irregularity at a central part of the liquid crystal panel can be perfectly prevented.

In the embodiment, the transfer device is always present at the lower side of the liquid crystal panel 8, thus causing no particular obstruction to removing the liquid crystal panel 8 from the apparatus. Even if the apparatus stops because of a failure or a like reason, the liquid crystal panel 8 can be removed from the apparatus. Thus, the apparatus has superior maintainability.

Figure 3:
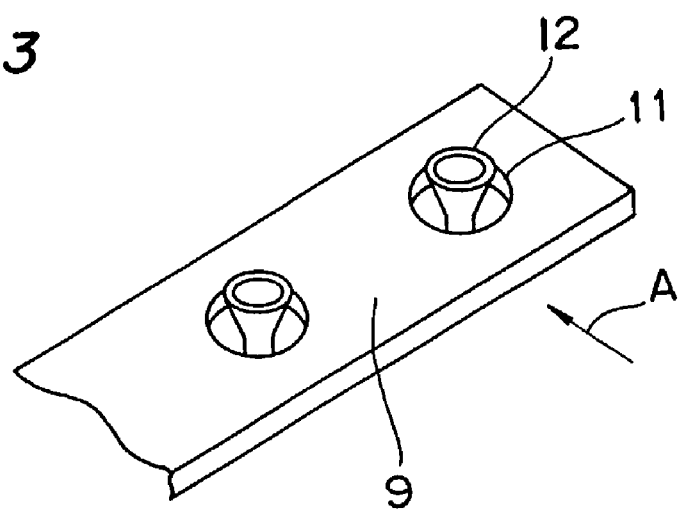
FIG. 3 is a perspective view of a leading end of a transfer arm in the first embodiment.
Figure 4:
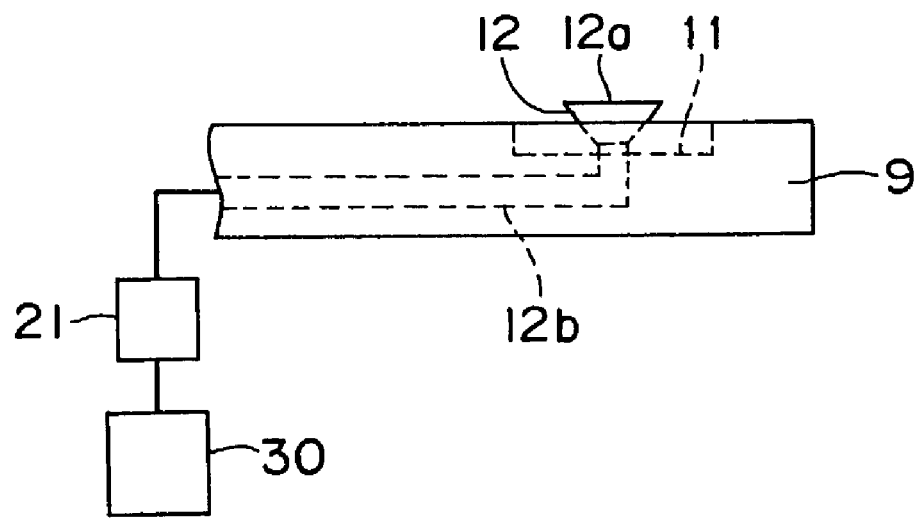
FIG. 4 is a side view of the leading end of the transfer arm in the first embodiment.
Figure 5:
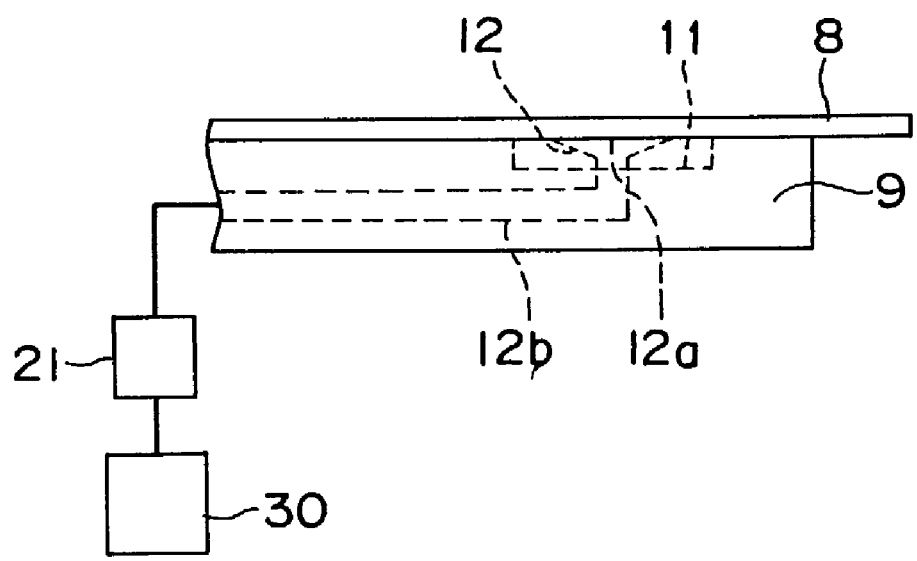
FIG. 5 is a side view of a liquid crystal panel in a state where the transfer arm holds a panel in the first embodiment.

Suction of the liquid crystal panel 8 by the transfer arms 9 will be described with reference to FIGS. 3–5. FIG. 3 is a perspective view of a leading end side of a transfer arm 9, and FIGS. 4 and 5 are views seen from a direction of arrow A of FIG. 3. As shown in FIGS. 3 and 4, the transfer arm 9 has suction pads 12 stored in holes 11 formed with countersunk holes. The suction pads 12 are formed of a buffering material such as silicone rubber or the like.

A leading end face 12*a* of each suction pad 12 is set to be higher by, e.g., approximately 1 mm than a surface of the transfer arm 9. This is so because, if the leading end face 12*a* is made even with the surface of the transfer arm 9, secure suction is hindered in an event that flatness of the transfer arm 9 and the liquid crystal panel 8 varies. That is, when the leading end face 12*a* is made slightly higher, the suction pad 12 of the buffering material can be turned ready to trace the liquid crystal panel 8, and therefore any variation in flatness can be absorbed to make suction sure.

A vacuum path 12*b* connected to the suction pads 12 is formed in each transfer arm 9, to which is connected suction device 21 controlled in operation by the control device 30. The leading end face 12*a* of the suction pad 12 comes into contact with the liquid crystal panel 8, whereby the liquid crystal panel 8 is held on each transfer arm 9 through vacuum suction by the suction device 21 via the vacuum path 12*b*. The suction pads 12, the vacuum path 12*b*, the suction device 21, and the control device 30 constitute an example of an adhesion suction device.

FIG. 5 shows a state in which the liquid crystal panel 8 is held by the transfer arms 9. The liquid crystal panel 8 sinks by its own weight in this state. Therefore, the suction pads 12 of the buffering material sufficiently fit the liquid crystal panel 8, while surely holding the liquid crystal panel 8. Since the liquid crystal panel 8 comes into contact with the transfer arm 9 in a manner that the suction pad 12 of the buffering material sinks without coming directly into face contact with each other, damages to the liquid crystal panel 8 can be prevented.

Figure 6:
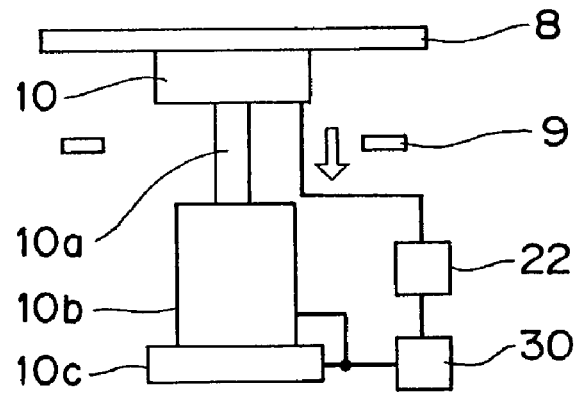
FIG. 6 is a diagram showing a transfer method for liquid crystal panels at each process in the first embodiment.
Figure 7:
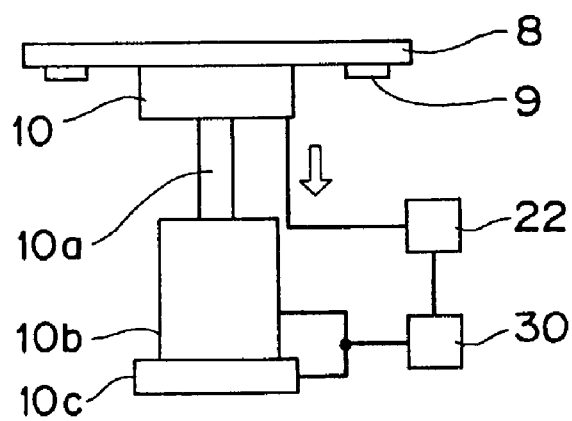
FIG. 7 is a diagram showing a transfer method for liquid crystal panels at each process in the first embodiment.
Figure 8:
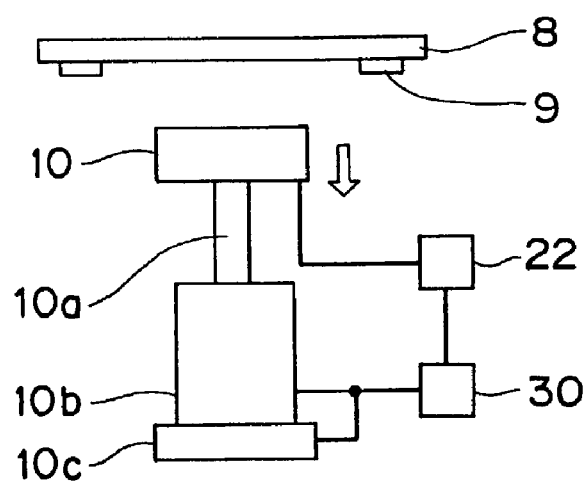
FIG. 8 is a diagram showing a transfer method for liquid crystal panels at each process in the first embodiment.

Referring to FIGS. 6–8, transfer of the liquid crystal panel within each process will be described below. FIGS. 6–8 are views seen from a direction of arrow B of FIG. 2 and indicate a liquid crystal panel completely processed by each process before being delivered to the transfer arms 9. For instance, liquid crystal panel 8 having the ACF completely attached by the ACF attachment part 2 as an example of each process is transferred while held at its lower side by panel stage 10 through vacuum suction to a place where the liquid crystal panel 8 is positioned immediately above the transfer arms 9, as indicated in FIG. 6. The panel stage 10 is connected to a suction device 22 controlled in operation by the control device 30, is moved up and down by a first driving device 10*b* controlled in operation by the control device 30, and moreover is moved in directions of arrows f and g described later by a second driving device 10*c* controlled in operation by the control device 30. The panel stage 10 with the first and second driving devices 10*b* and 10*c*, the suction device 22, and the control device 30 constitute an example of a movement device.

A shaft 10*a* integral with the panel stage 10 is lowered from a state in the thickness-direction of the liquid crystal panel 8 by the driving part 10*b*, whereby a lower face of the liquid crystal panel 8 comes into contact with the leading end face 12*a* of the suction pad 12 as shown in FIG. 5. Eventually the liquid crystal panel 8 is held on the transfer arms 9 as shown in FIG. 7. In this state, vacuum suction force is applied with the transfer arms 9 to the liquid crystal panel 8, whereas vacuum suction by the panel stage 10 is released.

When the shaft 10*a* is further lowered in the arrow direction in parallel to the thickness-direction, as shown in FIG. 8, the panel stage 10 completely separates from the liquid crystal panel 8, and the liquid crystal panel 8 is completely delivered to the transfer arms 9.

Conversely, for example, when the liquid crystal panel 8, held by a pair of the transfer arms 9 and disposed to meet the ACF attachment part 2, is to be transferred towards the ACF attachment part 2, the shaft 10*a* is moved upwardly by the driving part 10*b* in an opposite direction to the arrow along the thickness-direction from the state shown in FIG. 8, and then is driven from the state of FIG. 7 to the state of FIG. 6. The panel stage 10 is moved in the arrow f direction at a point in time when the liquid crystal panel 8 is finished being processed so as to be delivered from the pair of the transfer arms 9 to the panel stage 10.

Figure 9A:
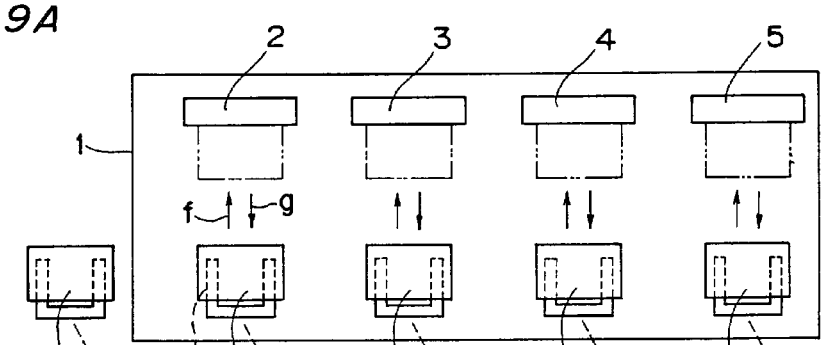
FIG. 9A is a schematic plan view of the component mounting apparatus in the first embodiment.
Figure 9B:
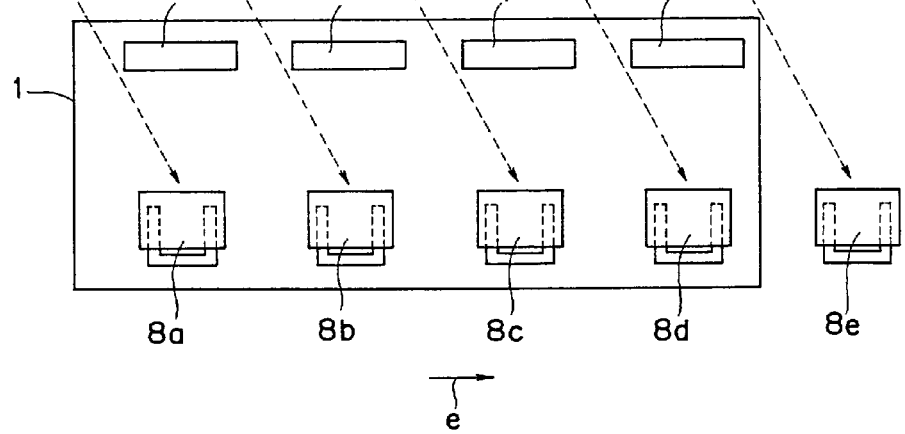
FIG. 9B is a schematic plan view of the component mounting apparatus in the first embodiment.

The transfer of the liquid crystal panel 8 between processes and, the transfer within each process are separately described hereinabove. Operation of the entire apparatus will now be depicted with the use of FIG. 9A and FIG. 9B. The operation of the electronic component mounting apparatus 1 is controlled by the control device 30. As described above, the transfer arms 9 and the panel stage 10 are both positioned on a side of the non display face of the liquid crystal panel 8, and therefore avoiding mutual interference is particularly required. The transfer arms 9 and panel stage 10 operate as will be described below while being controlled by the control device 30. FIGS. 9A and 9B are schematic simplified plan views of each part of the electronic component mounting apparatus 1 in FIG. 1. Each transfer arm will be denoted by reference numeral "6" again in FIGS. 9A, 9B and in the following description with reference to FIGS. 9A, 9B.

In a state indicated in FIG. 9A, each of liquid crystal panels 8a–8e is held on the transfer arms 6. This is a state after the liquid crystal panels 8b–8e in the electronic component mounting apparatus 1 are transferred in the arrow f direction, arranged at positions indicated by chain double-dashed lines, completely processed by corresponding processes in constituent parts 2–5, and then transferred in the arrow g direction from the positions of the chain double-dashed lines. The liquid crystal panels 8a and 8b are held respectively by a pair of transfer arms 6 of the driving device 20-1 at the temporary bonding side, while the liquid crystal panels 8c–8e are held respectively by a pair of transfer arms 6 of the driving device 20-2 at the permanent bonding side. The directions of the arrows f and g are orthogonal to both the transfer direction along the arrow direction 155 and the thickness-direction. Transfer in the arrow f and g directions is performed while the liquid crystal panels are raised by the panel stages 10 from the transfer arms 6. In this state, the liquid crystal panel 8a transferred from a different facility outside the electronic component mounting apparatus 1 is delivered to the pair of the transfer arms 6 of the driving device 20-1 at the temporary bonding side.

When the panel stage 10 and the transfer arms 6 are brought to a state at least not to interfere with each other by operation control of the control device 30; that is, when the panel stage 10 descends to a level not to obstruct a transfer operation of the transfer arms 6, each transfer arm 6 moves in a direction shown by the arrow e into a state shown in FIG. 9B. Specifically, as indicated by arrows of dashed lines, each of the liquid crystal panels 8a–8e is transferred to a position shown in FIG. 9B from a position shown in FIG. 9A in the arrow direction e of the electronic component mounting apparatus 1. Thereafter, each of the liquid crystal panels 8a–8d is delivered from a corresponding pair of the transfer arms 6 to a corresponding panel stage 10 from the state of FIG. 9B, and each panel stage 10 is transferred to in the arrow f direction of FIG. 9A, so that each liquid crystal panel 8a–8d is subjected to each process. During this time, each transfer arm 6 is moved in a direction opposite to the arrow e direction and returned to the state of FIG. 9A. After the transfer arms 6 are moved, each panel stage 10 holding a processed liquid crystal panel 8 is transferred in the arrow g direction and held on the transfer arms 6 again.

The liquid crystal panel 8e transferred to outside the electronic component mounting apparatus 1 is delivered to a different facility. Liquid crystal panels having ICs mounted thereon are sequentially sent out of the apparatus by repeating the above-described operation.

As above, each liquid crystal panel is transferred between processes while being held at its lower side by the transfer arms 6, and eventually transferred in a longitudinal direction inside the electronic component mounting apparatus 1. That is, each liquid crystal panel is transferred in the electronic component mounting apparatus 1 at all times in a state while held at its lower side.

Although an object to which the electronic components are to be mounted is a liquid crystal panel in the foregoing embodiment, the object is not limited to this and the same effect can be obtained for flat display panels such as plasma displays or the like.

Second Embodiment

A recognition apparatus for a component mount panel, a component mounting apparatus for a liquid crystal panel and, a component mounting method for a liquid crystal panel in a second embodiment of the present invention will be described with reference to the drawings in which like parts are designated by like reference numerals.

Figure 22:
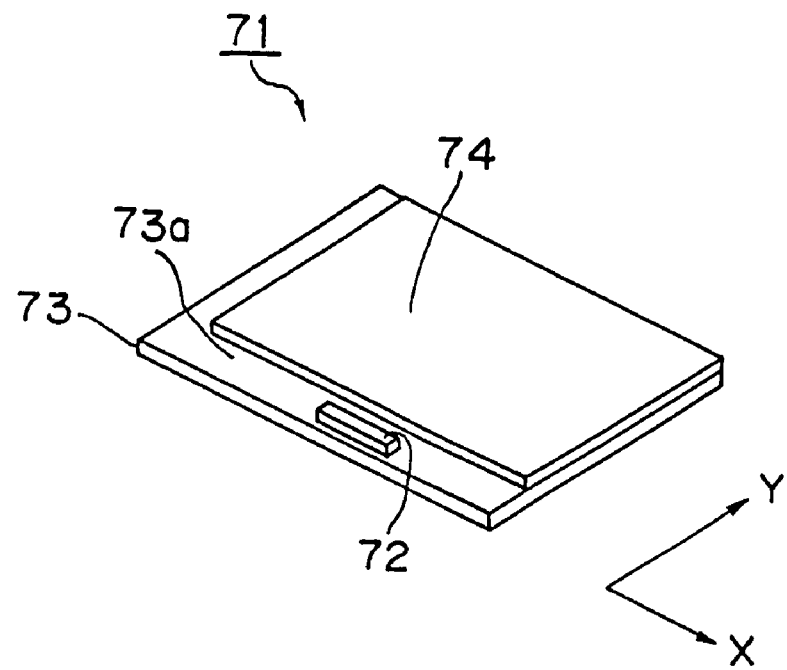
FIG. 22 is a perspective view of the liquid crystal panel.
Figure 23:
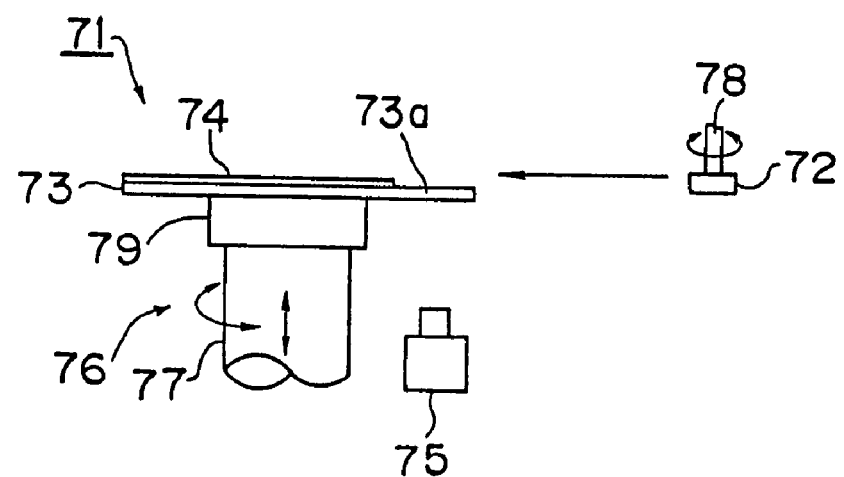
FIG. 23 is a diagram of a recognition operation for the liquid crystal panel in the conventional component mounting apparatus.
Figure 24:
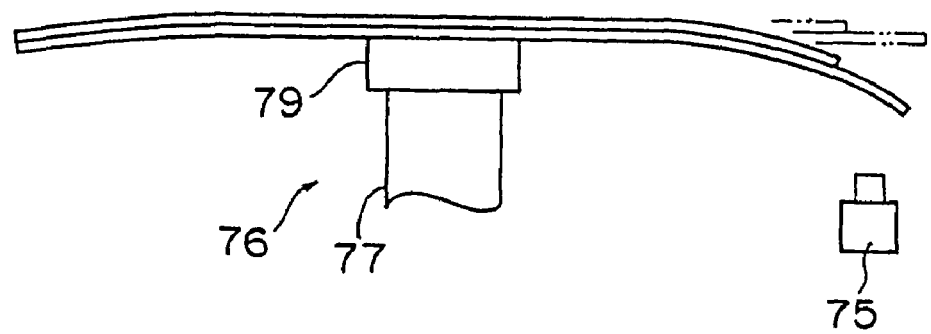
FIG. 24 is a diagram showing a state in which an image pickup operation is performed with the liquid crystal panel deflected in the conventional component mounting apparatus.
Figure 25:
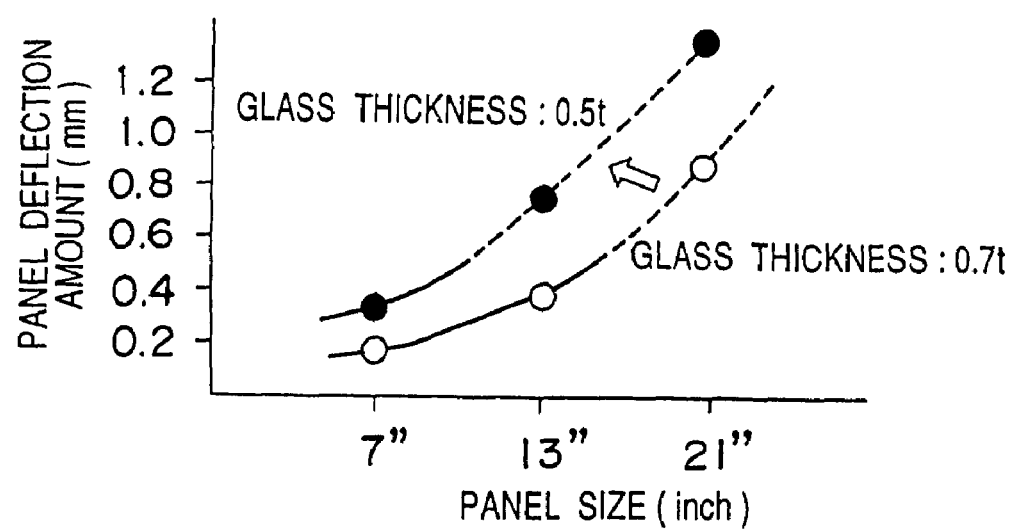
FIG. 25 is a graph showing a relationship between a size and a deflection amount of a liquid crystal panel.

The present embodiment adopts, as a panel to which components are to be mounted, a panel for liquid crystal display which is formed of a glass substrate such as the one described with reference to FIG. 22. However the panel is not restricted to a liquid crystal panel. Moreover, an electronic component will be discussed as an example functioning as a component.

Figure 15:
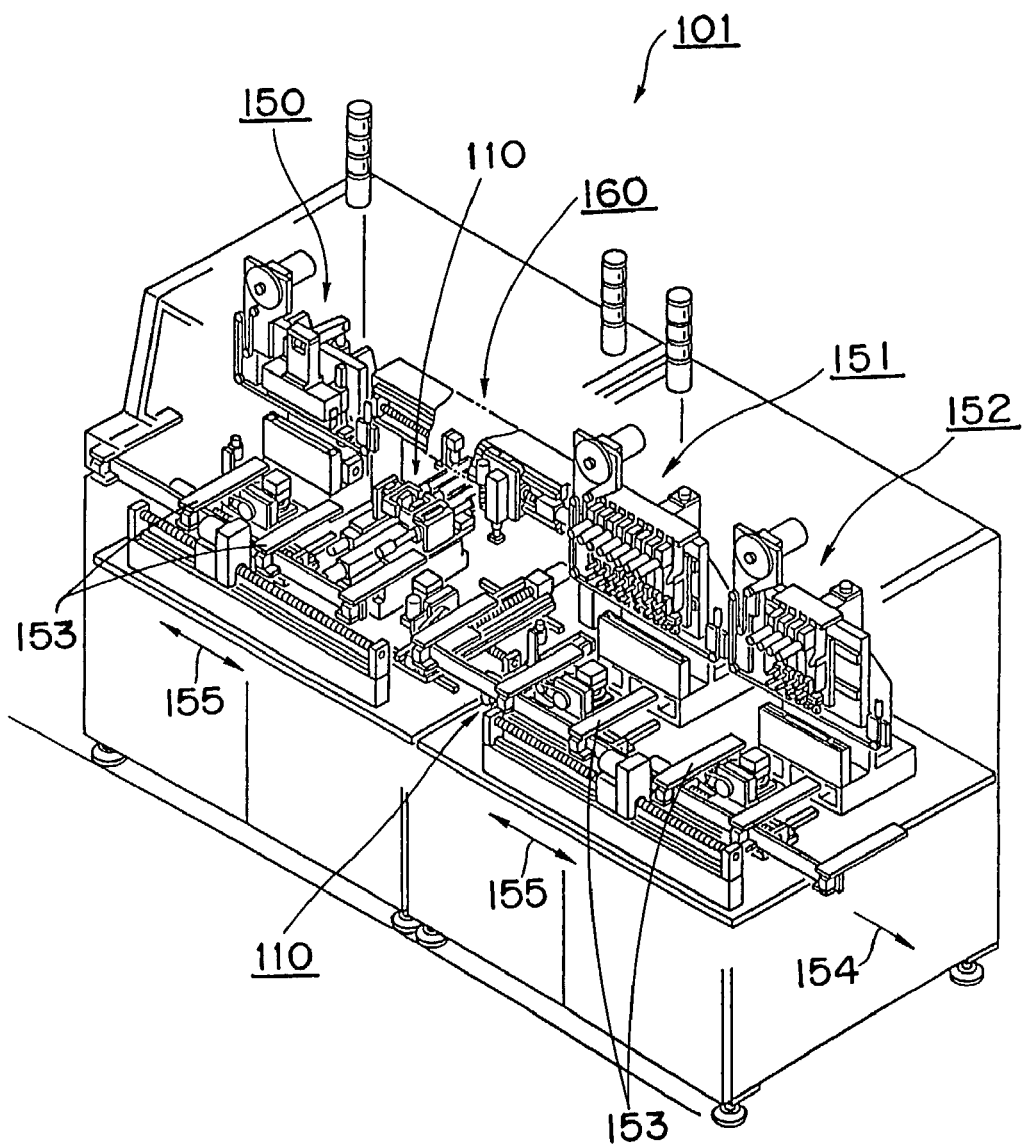
FIG. 15 is a perspective view of a component mounting apparatus for a liquid crystal panel according to another embodiment of the present invention.

A component mounting apparatus 101 for a liquid crystal panel with a recognition apparatus for a component mount panel, i.e., with a recognition apparatus for a liquid crystal panel in this embodiment is shown in FIG. 15. The component mounting apparatus 101 shown in FIG. 15 corresponds to the above-described electronic component mounting apparatus 1 shown in FIG. 1. In FIG. 15, 150 is an ACF (anisotropic conductive film) attaching apparatus for performing an ACF attachment process. The ACF attaching apparatus 150 corresponds to the ACF attachment part 2 in FIG. 1. 110 is a recognition apparatus for a liquid crystal panel and 160 is a component holding apparatus, which performs a temporary pressure bonding process for temporarily bonding components with pressure to liquid crystal panels. The recognition apparatus 110 and the component holding apparatus 160 correspond to the IC temporary pressure bonding part 3 shown in FIG. 1. 151 and 152 are permanent pressure bonding apparatuses for performing a permanent pressure bonding process for permanently bonding components with pressure to liquid crystal panels. The permanent pressure bonding apparatuses 151 and 152 correspond to the IC permanent pressure bonding part 4 of FIG. 1. 153 is a panel transfer part which can be reciprocated by a ball screw 156 in a direction of arrow 155. A liquid crystal panel is carried in from the left side of the component mounting apparatus 101 shown in FIG. 15, subjected sequentially to the ACF attachment process, the temporary pressure bonding process and the permanent pressure bonding process in a direction of arrow 154, and transferred. The panel transfer part 153 has transfer arms 6 as shown in FIG. 1.

The ACF attaching apparatus 150 is an apparatus for attaching to a liquid crystal panel an anisotropic conductive film tape, which is an adhesive tape including conductive particles, and is interposed between the liquid crystal panel and an electronic component to electrically connect electrodes of the electronic component and the liquid crystal panel by the conductive particles when the electronic component is pressed with heat onto the liquid crystal panel.

The recognition apparatus 110 will be described in detail later. The component hold apparatus 160 holds an electronic component which is to be mounted to a side edge part of the liquid crystal panel 71, registers the electronic component to the side edge part of liquid crystal panel 71, and temporarily pressure bonds the electronic component to the liquid crystal panel. The permanent pressure bonding apparatuses 151 and 152 permanently join the electronic component to the liquid crystal panel 71 while heating and pressing the electronic component with use of a press head.

The recognition apparatus 110 will be described below. The recognition apparatus 110 in this description picks up images of not only the liquid crystal panel 71, but also electronic component 72, because description here is directed to the component mounting apparatus 101 for a liquid crystal panel. However, the recognition apparatus 110 is fundamentally a recognition apparatus for recognizing panels.

Figure 10:
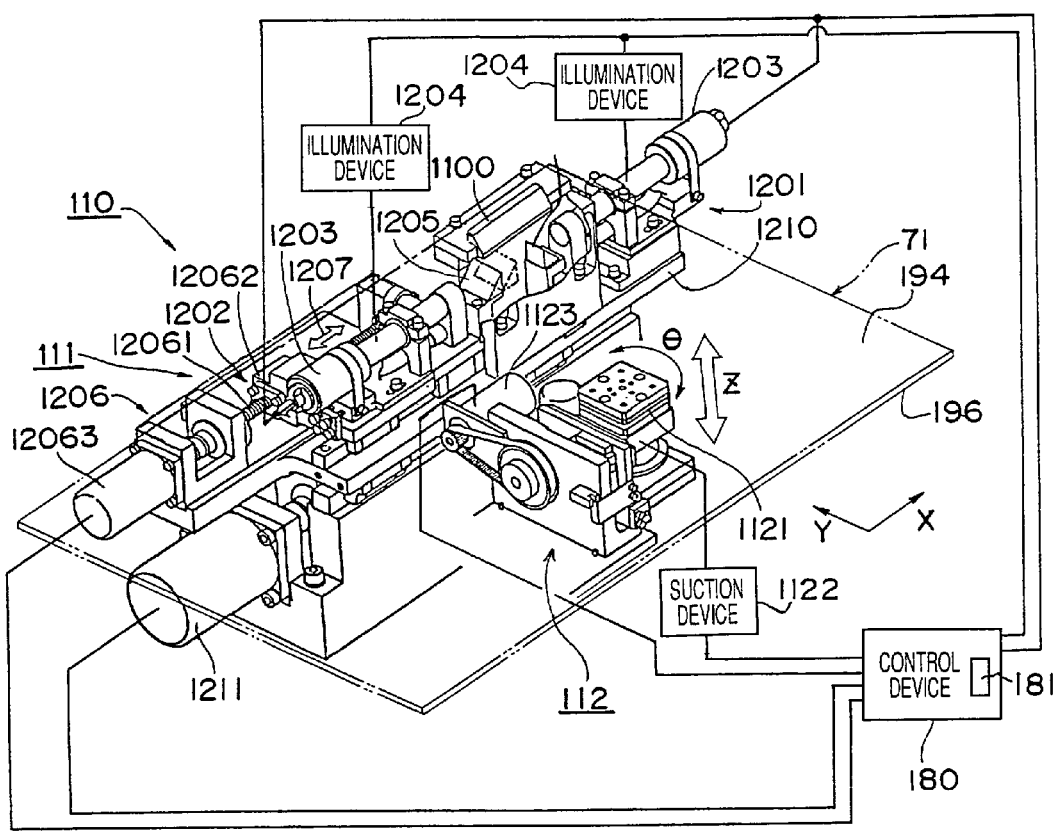
FIG. 10 is a perspective view of a liquid crystal recognition apparatus in a second embodiment of the present invention.

The recognition apparatus 110 roughly comprises an image pickup device 111, a panel holding device 112, and a control device 180 as shown in FIG. 10.

Figure 11:
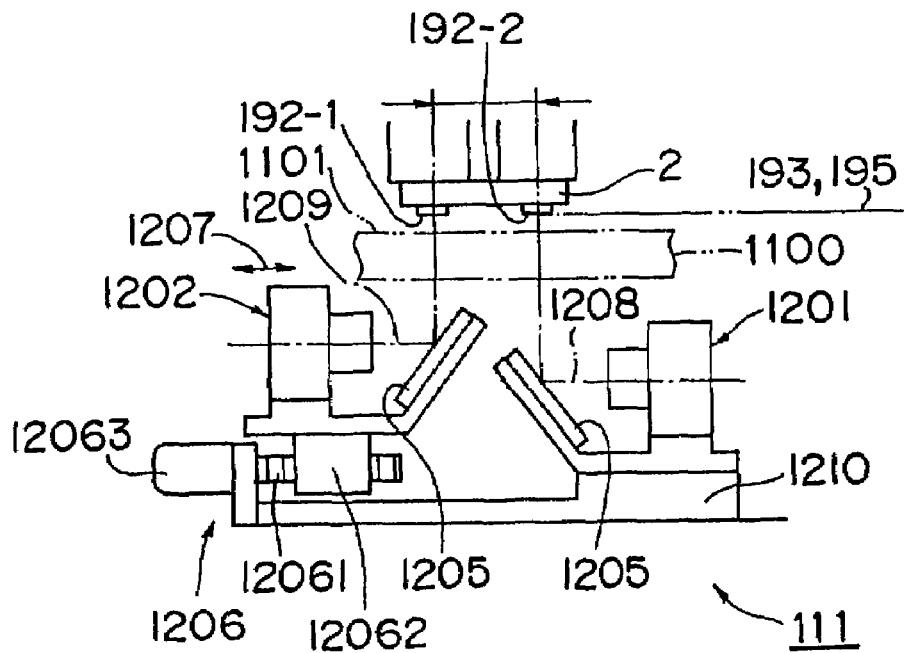
FIG. 11 is a front view showing a state in which an image pickup device shown in FIG. 10 picks up an image of an electronic component.
Figure 13:
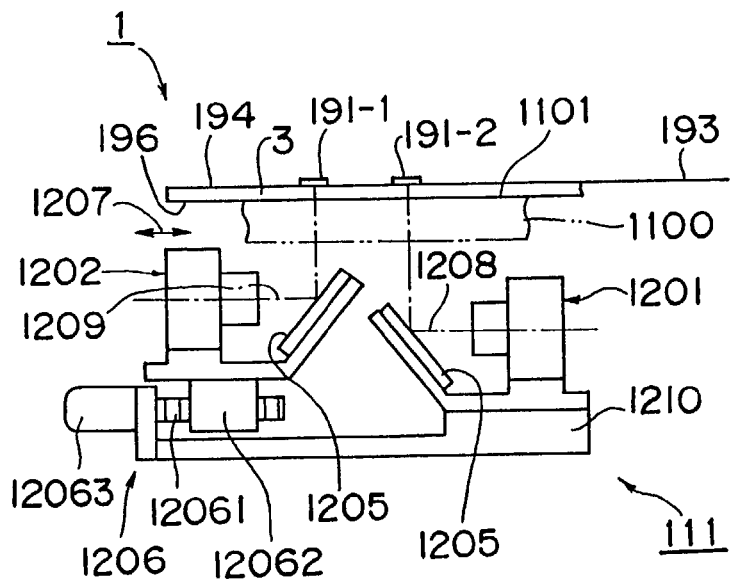
FIG. 13 is a front view showing the state in which the image pickup device shown in FIG. 10 picks up the image of the liquid crystal panel.

The recognition apparatus 110 is an apparatus for picking up images of panel marks 191-1 and 191-2 on the liquid crystal panel 71 which are disposed at a bonding height position 193 as a height-position to mount an electronic component as indicated in FIG. 13, and for picking up images of component marks 192-1 and 192-2 on the electronic component 72 which are disposed at a bonding height position 193 as shown in FIG. 11. The marks 191-1, 191-2, 192-1, and 192-2 indicated in FIGS. 11 and 13 can be specially formed for use as recognition marks, or can be specific parts of wirings, electrodes or the like formed on the electronic component 72 and glass plate 73 beforehand. The marks are slightly exaggerated in each drawing. The bonding height position 193 is a height position of an electronic component mount face 194 at the glass plate 73 in a thickness-direction of the liquid crystal panel 71 where the electronic component 72 is to be mounted onto the glass plate 73 of the liquid crystal panel 71, and corresponds to a height position of a mount face 195 of the electronic component 72 when mounted. Since a thickness of the glass plate 73 of the liquid crystal panel 71 may vary when a type of the liquid crystal panel 71 to be processed is changed, the bonding height position 193 is not a constant height position and is a height position of the electronic component mount face 194 when the liquid crystal panel 71 is placed on a stage 1100 which will be described later.

The panel marks 191-1, 191-2 and component marks 192-1, 192-2 are formed to detect deviations in X and Y directions between the liquid crystal panel 71 and the electronic component 72 sent into the recognition apparatus 110, and to detect a deviation therebetween about a Z axis parallel to the thickness-direction of the liquid crystal panel 71. Every two marks are necessary and sufficient. The panel marks 191-1 and 191-2 may be formed for each mount position of the electronic component 72 on the liquid crystal panel 71, or only one pair of the panel marks may be formed for one liquid crystal panel 71.

The image pickup device 111 roughly comprises a stage 1100, a fixed camera 1201, and a moving camera 1202.

Figure 12:
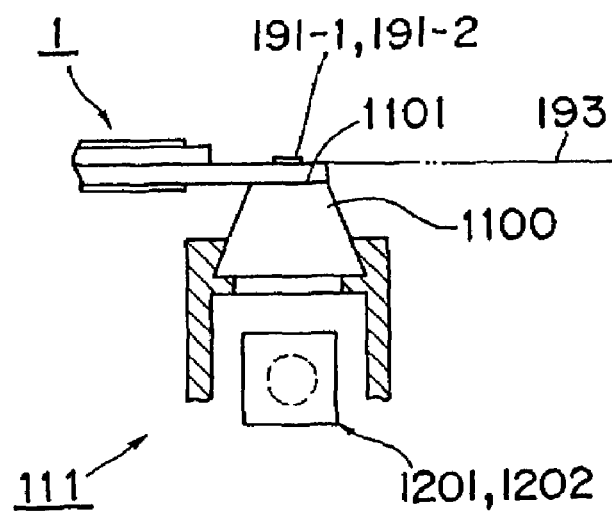
FIG. 12 is a side view showing a state in which the image pickup device shown in FIG. 10 picks up an image of a liquid crystal panel.

The stage 1100 becomes a support stage for placing the liquid crystal panel 71 thereon with the panel marks 191-1 and 191-2 faced thereto in picking up images of the panel marks 191-1 and 191-2 on the liquid crystal panel 71. This stage has a panel load flat face 1101 on which the liquid crystal panel 71 can be placed, as shown in FIGS. 10 and 12, and the stage is a light-passing support stage formed of quartz of a trapezoidal section in this embodiment. When the liquid crystal panel 71 is placed on the stage 1100, the panel marks 191-1 and 191-2 are positioned at the bonding height position 193. Therefore, when images of the panel marks 191-1, 191-2 and the component marks 192-1, 192-2 on the electronic component 72 are to be picked up by the fixed camera 1201 and movable camera 1202, these images are picked up through the stage 1100. Furthermore, although the electronic component 72 is pressed down to the liquid crystal panel 71 when the electronic component 72 is to be mounted onto the liquid crystal panel 71, the stage 1100 operates as a support stage for supporting the liquid crystal panel 71 at this time.

Each of the fixed camera 1201 and movable camera 1202 has a camera 1203 as an image pickup part equipped with, for example, a CCD (charge coupled device) as shown in FIG. 10 for picking up images of the marks 191-1, 191-2 and 192-1, 192-2, an illumination device 1204 for image pickup, and a mirror 1205 for reflection. The fixed camera and movable camera are arranged to be opposite to each other on an equal line. As shown in FIGS. 11–13, the fixed camera 1201 and movable camera 1202 are arranged so that mirrors 1205 for reflection are positioned below the stage 1100.

The fixed camera 1201 is fixed to a base plate 1210 of the image pickup device 111. On the other hand, the movable camera 1202 can be moved by a moving device 1206 on the base plate 1210 along the line. The moving device 1206 has a so-called ball screw structure having the movable camera 1202 fixed to a nut part 12062 engaged with a screw part 12061, which moves the movable camera 1202 in a direction of arrow 1207 along the line by rotating the screw part 12061 about its axis by a motor 12063 as a driving part.

Each of arrangement intervals between the fixed camera 1201 and movable camera 1202 in the arrow 1207 direction is, as indicated in FIGS. 11 and 13, set so that optical axes from the fixed camera 1201 and movable camera 1202 conform to a distance between the panel marks 191-1 and 191-2, and a distance between the component marks 192-1 and 192-2 in the arrow direction 1207. The arrangement intervals are preliminarily set, for example, for each type of the liquid crystal panel 71 and electronic component 72 carried into the component mounting apparatus 101, and set values of the intervals are stored, e.g., in a memory part 181 of control device 180. The control device 180 moves the movable camera 1202 to provide the arrangement intervals corresponding to each liquid crystal panel 71 and electronic component 72.

The illumination device 1204 is specifically equipped with a first light source for illuminating optical axis parts of the fixed camera 1201 and movable camera 1202, and a second light source for illuminating a circumference of the optical axis parts. The control device 180 controls a luminance at the first and second light sources so that the panel marks 191-1, 191-2 and component marks 192-1, 192-2 can be recognized best.

Figure 17:
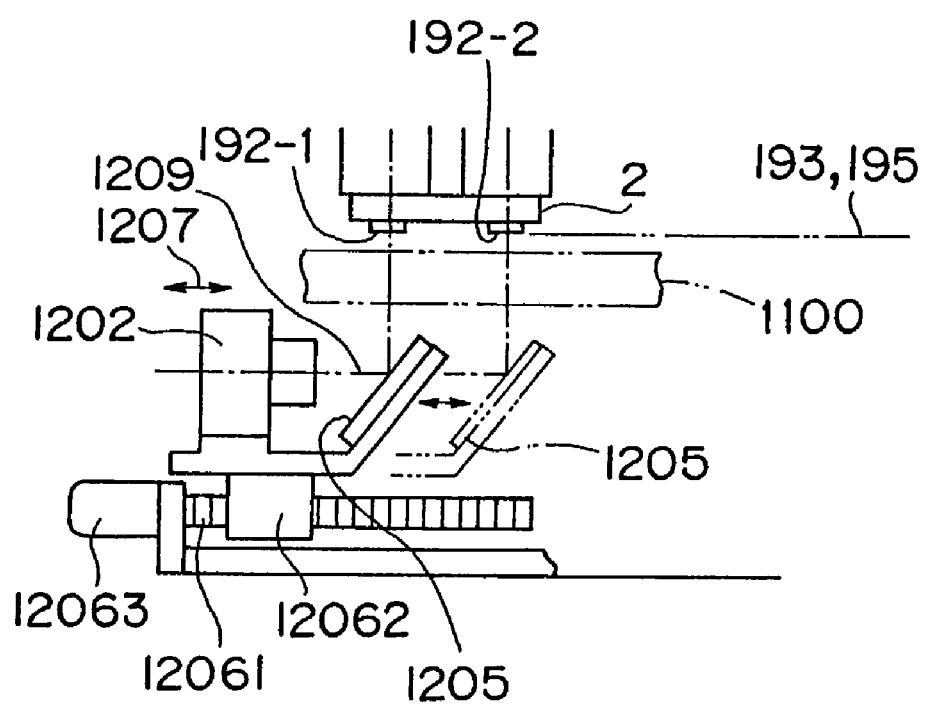
FIG. 17 is a diagram of a modified example of the image pickup device of FIG. 10.

As above, since every two marks are provided as the panel marks 191-1, 191-2 and component marks 192-1, 192-2, according to this embodiment, a set of the fixed camera 1202 and the movable camera 1202 is prepared, and each set of the panel marks 191-1, 191-2 and the component marks 192-1, 192-2 is recognized at one time by the fixed camera 1201 and movable camera 1202 disposed beforehand to meet intervals of the panel marks 191-1 and 191-2, and of the component marks 192-1 and 192-2. Operation in this manner improves a Tact. However, if the Tact improvement is negligible, as shown in FIG. 17, only one movable camera may be prepared, thereby recognizing the panel marks 191-1, 191-2 and the component marks 192-1, 192-2 one by one by moving the movable camera.

For avoiding interference of reflection mirrors 1205 of the movable camera 1202 and the fixed camera 1201 when the movable camera 1202 approaches the fixed camera 1201, and enabling the cameras approach to be close, as shown in FIG. 11, the fixed camera 1201 and movable camera 1202 are disposed with optical axes 1208 and 1209 shifted in the thickness-direction of the liquid crystal panel, i.e., in the Z direction. In this embodiment, a minimum interval in the arrow 1207 direction between the panel marks 191-1 and 191-2 and between the component marks 192-1 and 192-2 is set to be 10 mm. The fixed camera 1201 and movable camera 1202 can be aligned to meet the minimum interval.

Further, the base plate 1210 with the fixed camera 1201 and movable camera 1202 loaded thereon can be moved in the arrow 1207 direction by a motor 1211 as a driving part.

The camera 1203, the illumination device 1204, and the motor 12063 are connected to the control device 180 and controlled in operation by the control device 180.

The panel holding device 112 is a device for holding liquid crystal panel 71 carried into the recognition apparatus 110, and for moving and arranging this held liquid crystal panel 71 relative to the image pickup device 111 so that panel marks 191-1 and 191-2 are recognized by the image pickup device 111. The panel holding device includes a hold part 1121, an XY-driving part, a Z-driving part 1123, and a θ-driving part.

The hold part 1121 holds the liquid crystal panel 71, at a side of a stage contact face 196, to the stage 1100 through suction by a suction device 1122 in this embodiment. The XY-driving part moves the liquid crystal panel in the X and Y directions along a plane of the liquid crystal panel 71, and the Z-driving part 1123 moves the liquid crystal panel 71 in the Z direction which is the thickness-direction of the liquid crystal panel 71. The θ-driving part moves the liquid crystal panel 71 in a θ direction, namely, in a direction about the Z axis. These hold part 1121, XY-driving part, Z-driving part 1123, and θ-driving part are connected to the control device 180 and controlled in operation by the control device 180.

In FIG. 10, a relative size of the devices is not illustrated in conformity with an actual size of the devices in order to show the image pickup device 111, the panel holding device 112, and the like. For instance, the hold part 1121 actually holds approximately a central part of the liquid crystal panel 71 and is larger in size than illustrated.

Figure 14:
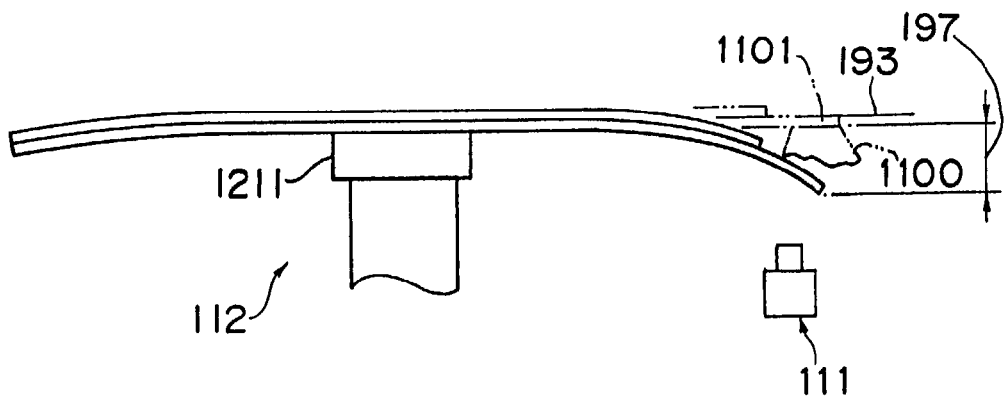
FIG. 14 is a view of a state in which the liquid crystal panel deflects when held by a panel holding apparatus shown in FIG. 10.

As discussed with reference to FIG. 12, in accordance with liquid crystal panel 71 being increased in size, thinned and reduced in weight, an amount of deflection at a mount portion of electronic component 72 increases. According to this embodiment, a deflection amount 197, generated as shown in FIG. 14 when the liquid crystal panel 71 to be processed by the component mounting apparatus 101 is held by the panel holding device 112, is measured beforehand. When the liquid crystal panel 71 is placed on the stage 1100 to have an image picked up by the image pickup device 111, the control device 180 controls the Z-driving part 1123 of the panel holding device 112 so that the panel marks 191-1 and 191-2 are located at the bonding height position 193 while negating the deflection amount 197 of the liquid crystal panel 71 generated as a result of being held by the hold part 1121 of the panel holding device 112. Needless to say, the control device 180 knows beforehand information on a thickness of glass plate 73 of the liquid crystal panel 71 held by the hold part 1121, and a height position of the panel load face 1101 of the stage 1100 from a reference height position. Therefore, the control device 180 controls the Z-driving part 1123 on a basis of the thickness of the glass plate 73, height position of the panel load face 1101, and deflection amount 197 to position the panel marks 191-1 and 191-2 to the bonding height position 193.

The deflection amount 197 is stored in the memory part 181 of the control device 180, and read from the memory part 181 if necessary.

In this embodiment, the deflection amount 197 is a value preliminarily measured and set for each side where each of the side edge parts 73$a$ of the liquid crystal panel 71 is present. In controlling the Z-driving part 23, the value, set for the side where the panel marks 191-1 and 191-2 are present, is used.

The liquid crystal panel 71 is put on the stage 1100 also when the electronic component 72 is to be mounted to the side edge part 73$a$ of the glass plate 73. Therefore, the liquid crystal panel 71 is required to be placed on the stage 1100 with the deflection amount 197 eliminated when the electronic component is to be mounted to the liquid crystal panel. Although the value, corresponding to the deflection amount 197, set for the side is usable for control to operate the Z-driving part 1123, a value measured and set beforehand at a component mount portion at the side edge part 73$a$ for the electronic component 72 may be utilized.

In comparison with a case where the value, corresponding to the deflection amount 197, set for the side is used, the liquid crystal panel 71 can be less deflected if the deflection amount 197 measured at the component mount portion for the electronic component 72 is used. In other words, the deflection amount is assumed to often differ depending on each component mount portion when a plurality of component mount portions are present at one side. Thus, stress to the liquid crystal panel 71 can be reduced by using the deflection amount 197 at an individual component mount portion rather than by using the deflection amount uniformly for all component mount portions.

Figure 18:
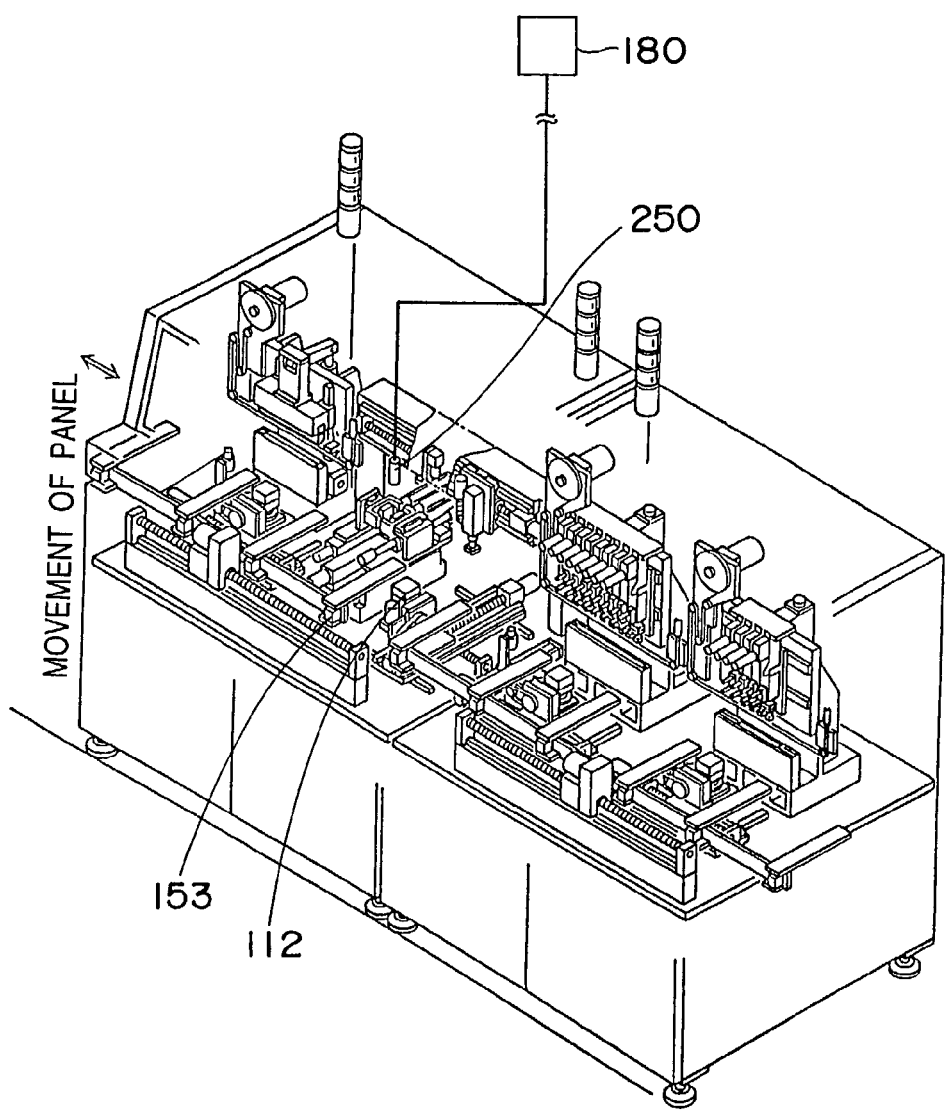
FIG. 18 is a diagram of a modified example, having a deflection detection device, of the liquid crystal panel recognition apparatus of FIG. 10.
Figure 19:
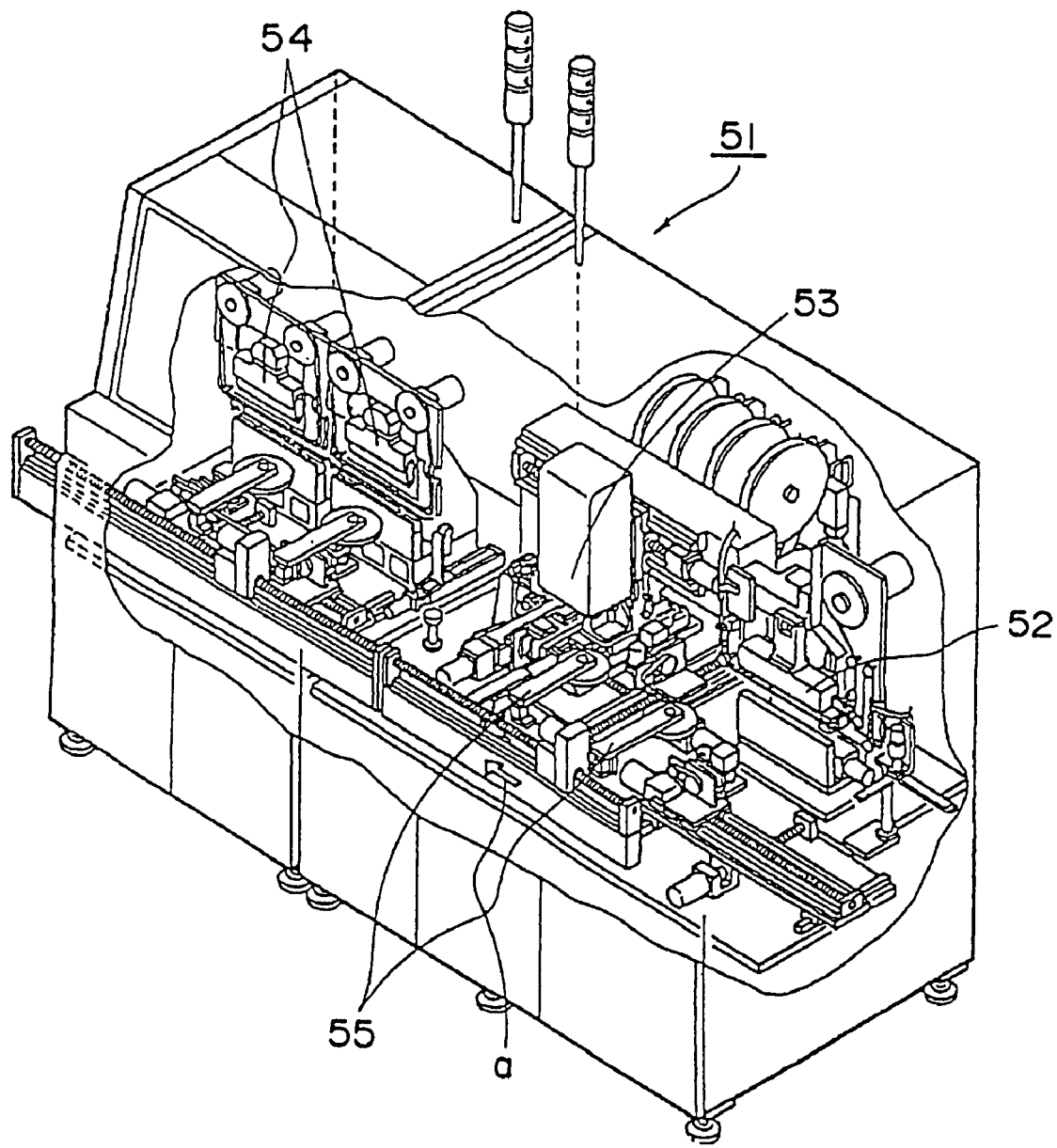
FIG. 19 is a perspective view of an example of a conventional electronic component mounting apparatus.
Figure 20:
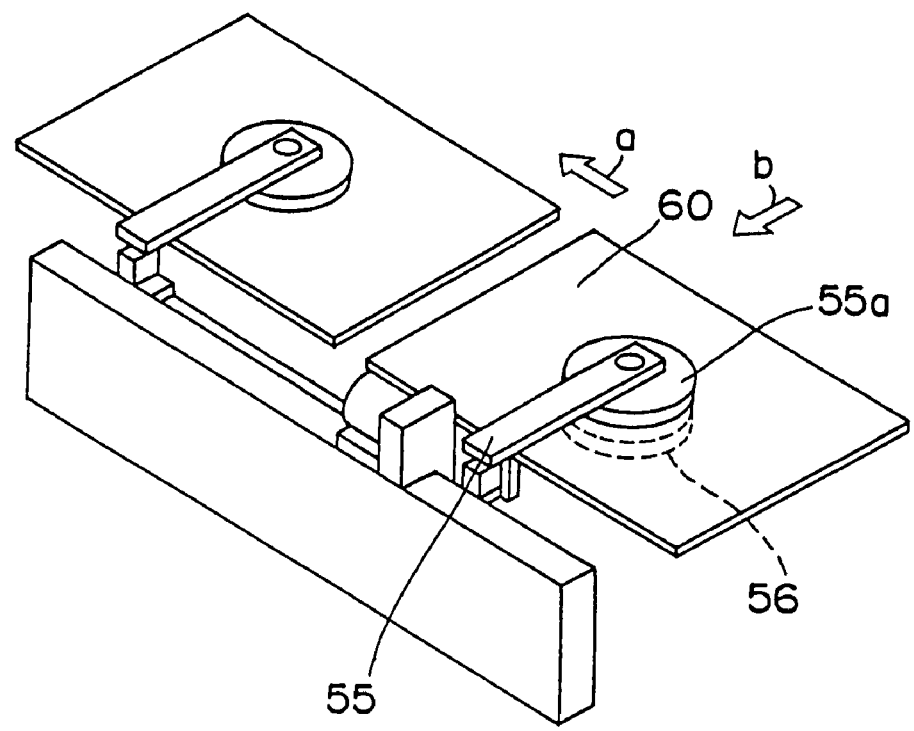
FIG. 20 is a perspective view showing an example of a conventional transfer method for liquid crystal panels.
Figure 21:
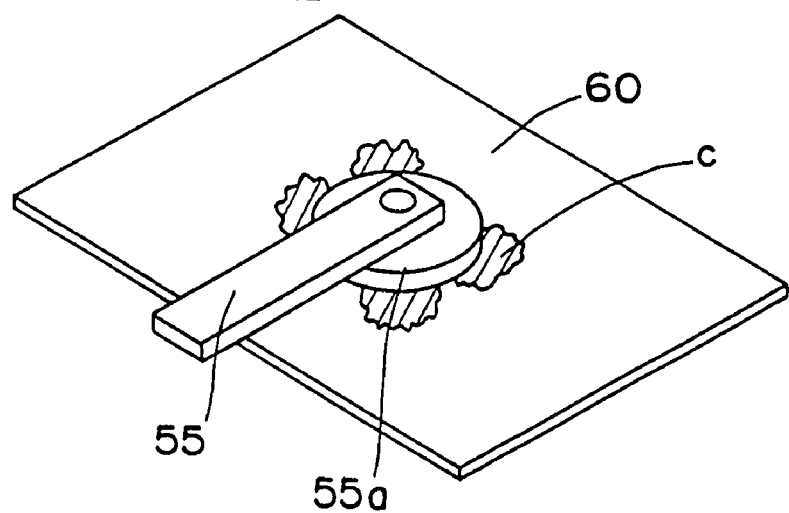
FIG. 21 is a perspective view showing an example of a state in which a liquid crystal panel is conventionally held.

In an arrangement as shown in FIG. 18, a deflection detection device 250 having a laser distance measurement device is installed above a position where the panel transfer part 153 loads a liquid crystal panel onto the panel holding device 112. A deflection amount of the component mount portion of the liquid crystal panel 71 for the electronic component 72 is detected by the deflection detection device 250 with utilization of movement subsequent to carrying in the liquid crystal panel, and of rotational movement for changing a measurement position of the liquid crystal panel, before the liquid crystal panel 71 is set to the image pickup device 111. The control device 180 can be adapted to control the panel holding device 112 in operation based on deflection amount 197 supplied from the deflection detection device 250.

The deflection detection device 250 is not limited to a non-contact deflection measurement structure using a laser distance measurement device as above. A structure whereby a probe is brought into contact with a liquid crystal panel to measure a deflection amount may be employed. Moreover, a point where a deflection amount is measured by the deflection detection device 250 is not limited to the aforementioned component mount portion, and may be at least one point on each side to obtain a deflection amount of each side of the liquid crystal panel. Alternatively, a deflection amount of, for example, a liquid crystal panel prepared for measuring the deflection amount, or a first produced liquid crystal panel or every predetermined sheets of liquid crystal panels, is measured by the deflection detection device 250, and then this measured value may be applied to liquid crystal panels produced afterwards.

According to this arrangement, stress produced in the liquid crystal panel 71 can be furthermore reduced.

Figure 16:
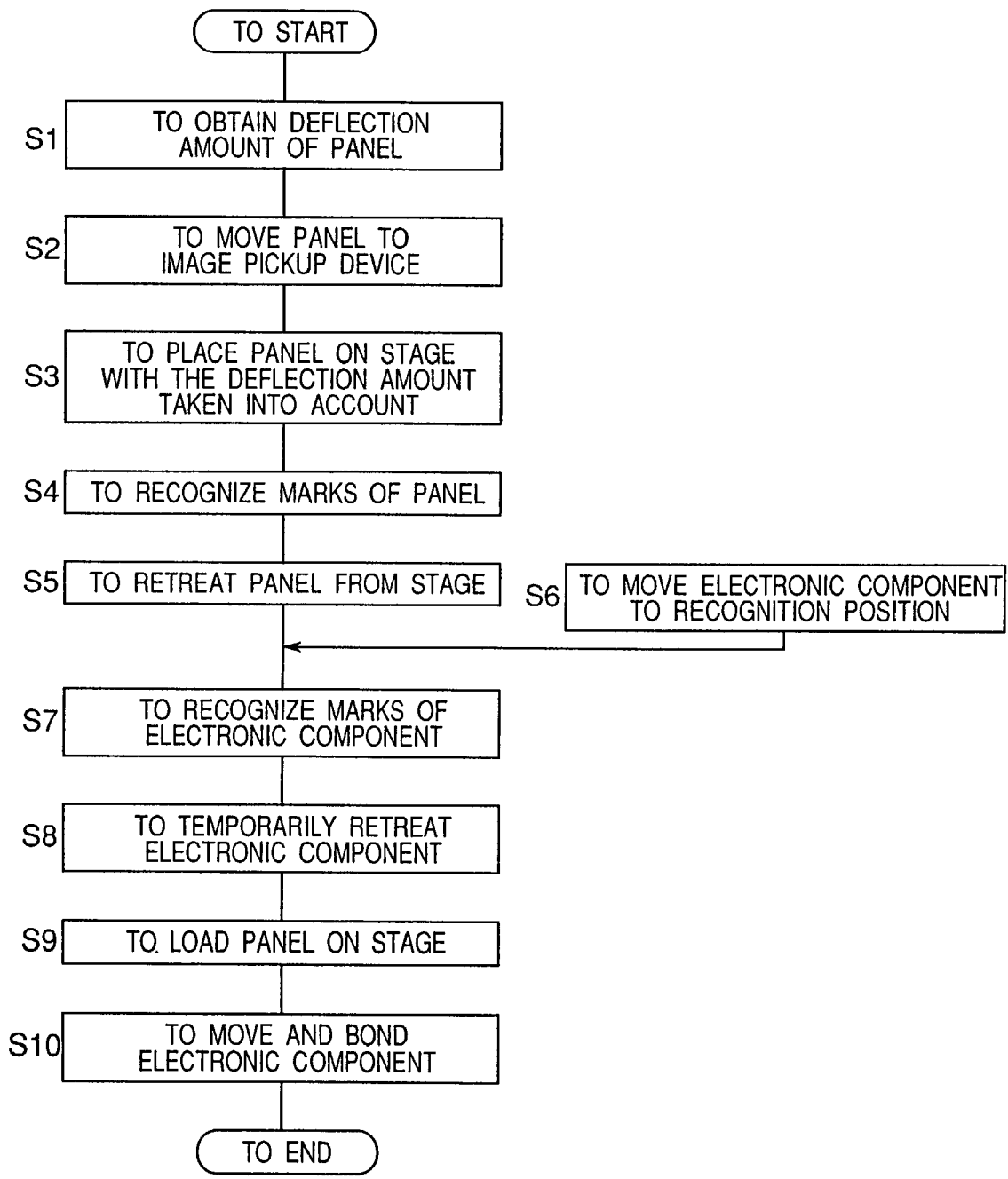
FIG. 16 is a flow chart showing operation of the component mounting apparatus for a liquid crystal panel of FIG. 15.

Referring to FIG. 16, an operation for mounting components in the component mounting apparatus 101 constituted as above will be discussed hereinbelow including a recognition operation for panel marks 191-1 and 191-2 at the recognition apparatus 110. This mounting operation is executed by operational control of the control device 180. The control device 180 is naturally acknowledged of a type of the liquid crystal panel 71 to be processed and a type of the electronic component 72 to be mounted to the liquid crystal panel 71.

In step (represented by "S") 1 in FIG. 16, the deflection amount 197 of the liquid crystal panel 71 at points where the panel marks 191-1 and 191-2 are present is read from the memory part 181. In step 2, the liquid crystal panel 71 held by the hold part 1121 through a suction operation performed by the suction device 1122 is moved by the panel holding device 112 to the image pickup device 111.

In the constitution where the deflection detection device 250 is installed to detect the deflection amount 197 as discussed above, step 1 is omitted and the deflection amount 197 is detected in step 2.

In step 3, the liquid crystal panel 71 is placed onto the stage 1100 to correspond portions including the panel marks 191-1 and 191-2 of the liquid crystal panel to the stage 1100. When the liquid crystal panel is so loaded, the Z-driving part 1123 is controlled to eliminate a deflection corresponding to read out deflection amount 197, thereby adjusting a position of the hold part 1121 in the Z direction. The panel marks 191-1 and 191-2 are positioned to the bonding height position 193 when the liquid crystal panel 71 is loaded onto the stage 1100.

In step 4, images of the panel marks 191-1 and 191-2 are picked up through the stage 1100 by the fixed camera 1201 and movable camera 1202, and picked up information is sent to the control device 180 from the image pickup device 111. In step 5 subsequent to this pickup operation, according to the present embodiment, the liquid crystal panel 71 is temporarily released from the stage 1100 so as to prevent the electronic component 72 and the liquid crystal panel 71 from interfering with each other during operations of following steps 6 and 7. The liquid crystal panel 71 is retreated from the stage 1100.

In step 6, the electronic component 72 held by the component holding device 160 is arranged so that the component marks 192-1 and 192-2 are positioned to the bonding height position 193 above the stage 1100. In step 7, images of the component marks 192-1 and 192-2 are picked up through the stage 1100 by the fixed camera 1201 and movable camera 1202.

In step 8 after this pickup operation, the electronic component 72 is retreated from above the stage 1100 so as to avoid interference between the electronic component 72 and the liquid crystal panel 71 during operation of next step 9.

In step 9, the liquid crystal panel 71 is placed onto the stage 1100 so that a component mount portion of the liquid crystal panel 71 held by the panel holding device 112 is supported by the stage 1100. At this time, similar to step 3, the Z-driving part 1123 is controlled by the control device 180 to operate so as to eliminate deflection on a basis of the deflection amount 197 at a side of the liquid crystal panel 71 where the component mount portion is present, or on a basis of the deflection amount 197 at the component mount portion. Moreover, the control device 180 obtains a positional correction amount for the liquid crystal panel 71 based on recognition information of the panel marks 191-1, 191-2 and component marks 192-1, 192-2 recognized in steps 4 and 7 so that the electronic component 72 is mounted to a specified position of the component mount portion, thereby controlling the panel holding device 112.

In next step 10, the electronic component 72 held by the component holding device 160 is arranged at the specified position of the component mount portion and, pressed to the liquid crystal panel 71, whereby the electronic component 72 is mounted to the liquid crystal panel 71.

In the embodiment as described above, the liquid crystal panel 71 is located and placed on the stage 1100 so that the panel marks 191-1, 191-2 or the component mount portion coincides with the stage 1100, and furthermore when being placed onto the stage 1100, on the basis of the deflection amount 197 of a part of the liquid crystal panel 71 where the panel marks 191-1 and 191-2 are present or where the component mount portion is present, the liquid crystal panel 71 is controlled in movement in the thickness-direction to eliminate the deflection amount 197. Therefore, the panel marks 191-1 and 191-2 can be recognized and the electronic component 72 can be mounted to the component mount portion in a state without or nearly without any deflection at the panel marks 191-1 and 191-2, or at the component mount portion. Since the panel marks 191-1 and 191-2 can be recognized with a higher accuracy than in the conventional art, an accuracy for mounting the electronic component 72 to a component mount portion can be improved as compared with the conventional art, and an inappropriate stress to the liquid crystal panel 71, when the electronic component 72 is pressed to the liquid crystal panel 71 during a mounting operation, is eliminated.

In addition, the panel marks 191-1 and 191-2 are recognized in a state while the liquid crystal panel 71 is placed on the stage 1100 with deflection eliminated. The panel marks 191-1 and 191-2 at this time are positioned to the bonding height position 193 as described above. On the other hand, the component marks 192-1 and 192-2 of the electronic component 72 are recognized in a state while positioned at the bonding height position 193. The panel marks 191-1, 191-2 and the component marks 192-1, 192-2 are picked up at the same bonding height position 193, and the electronic component 72 is mounted to the liquid crystal panel 71 at the bonding height position 193. An extra movement between an image pickup position and a mount position, generated if the image pickup position and mount position are different, is theoretically eliminated in this embodiment. An error in mechanism caused by the extra movement is hence prevented, and an accuracy for mounting the electronic component 72 is improved in comparison with the conventional art.

Although the panel marks 191-1 and 191-2 are first picked up in the present embodiment as described above, the component marks 192-1 and 192-2 may be picked up first to shorten the Tact of an entire component mounting operation, to reduce a number of operations performed by the panel holding device 112, and to improve mounting accuracy. Further, after images of component marks are picked up, the electronic component 72 can be retreated temporarily in a vertical direction and, then images of the panel marks 191-1 and 192-2 are picked up and this retreated electronic component 72 is moved down to perform mounting.

In a component mounting apparatus of a combination of the above first and second embodiments, suction irregularity to transferred panels can be prevented and mounting accuracy for components to be mounted to panels can be improved as compared with the conventional art, so that a quality of panels such as liquid crystal panels or the like can be improved in comparison with the conventional art.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A component mounting apparatus for mounting a component onto a flat display panel, comprising:
   a transfer device for transferring a flat display panel between processing stations, said transfer device including
   (i) transfer arms having an upper planar surface, and
   (ii) suction devices, not defining any portion of said upper planar surface of said transfer arms, for sucking a lower surface of the flat display panel, when the flat display panel is loaded onto said transfer arms, such that the lower surface of the flat display panel is positioned at said upper planar surface of said transfer arms so as to have the flat display panel held on said transfer arms in a state that the lower surface of the flat display panel is in contact with said upper planar surface of said transfer arms.

2. The component mounting apparatus according to claim 1, wherein
   said transfer device is constructed and arranged to be positioned opposite to a working area of one of the processing stations, and to transfer the flat display panel opposite to a working area of another one of the processing stations after the flat display panel has been processed in the working area of the one of the processing stations and delivered to said transfer device.

3. The component mounting apparatus according to claim 2, further comprising:
   a movement device at the one of the processing stations for supporting the flat display panel at the lower surface of the flat display panel, for moving the flat display panel at least in up-and-down and back-and-forth directions, and for delivering the flat display panel to said transfer device after having been processed in the working area of the one of the processing stations.

4. The component mounting apparatus according to claim 3, wherein
   said movement device is constructed and arranged to
   (i) raise the flat display panel, when on said transfer arms while said transfer device is positioned opposite to the working area of the one of the processing stations, so as to remove the flat display panel from said transfer arms, then
   (ii) transfer the flat display panel into the working area of the one of the processing stations, then
   (iii) transfer the flat display panel to a position above said transfer arms after the flat display panel has been processed in the working area of the one of the processing stations, and then
   (iv) lower the flat display panel onto said transfer arms.

5. The component mounting apparatus according to claim 1, wherein
   said transfer arms comprise two transfer arms for supporting the flat display panel at opposite ends of the flat display panel.

6. The component mounting apparatus according to claim 1, wherein
   each of said suction devices includes pad parts for contacting the lower surface of the flat display panel, with said suction devices for sucking the lower surface of the flat display panel through said pad parts, and with said pad parts being of a buffering material such that
   (i) upper end faces of said pad parts are positioned above said upper surface of a corresponding one of said transfer arms when the lower surface of the flat display panel is not being sucked by said suction devices through said pad parts, and
   (ii) upper end faces of said pad parts are positioned at said upper surface of said corresponding one of said transfer arms when the lower surface of the flat display panel is being sucked by said suction devices through said pad parts.

7. A method for mounting a component onto a flat display panel, comprising:
   holding a flat display panel with transfer arms by applying suction, via suction devices, to a lower surface of said flat display panel such that said lower surface of said flat display panel becomes positioned at an upper planar surface of said transfer arms in a state that said lower surface of said flat display panel is in contact with said upper surface of said transfer arms, with said suction devices not defining any portion of said upper planar surfaces of said transfer arms; and
   transferring said flat display panel between processing stations while said flat display panel is held with said transfer arms.

8. The method according to claim 7, wherein said transfer arms and said suction devices are part of a transfer device such that
   (i) holding a flat display panel with transfer arms by applying suction to a lower surface of said flat display panel comprises using said suction devices to apply suction to said lower surface of said flat display panel while said flat display panel is on said transfer arms, and
   (ii) transferring said flat display panel between processing stations comprises using said transfer device to transfer said flat display panel between said processing stations.

9. The method according to claim 8, further comprising:
   prior to transferring said flat display panel between said processing stations,
   (i) raising said flat display panel, when on said transfer arms while said transfer device is positioned opposite to a working area of one of said processing stations, thereby removing said flat display panel from said transfer arms, then
   (ii) transferring said flat display panel into said working area of said one of said processing stations, then
   (iii) transferring said flat display panel to a position above said transfer arms after said flat display panel has been processed in said working area of said one of said processing stations, and then
   (iv) lowering said flat display panel onto said transfer arms.

10. A component mounting apparatus for a liquid crystal panel, comprising:
    an image pickup device for
    (i) picking up images of panel marks on a liquid crystal panel onto which a component is to be mounted, while said panel marks are at a bonding height position in a thickness-direction of the liquid crystal panel when the component is to be mounted onto the liquid crystal panel, and
    (ii) picking up images of component marks on the component while the component marks are at the bonding height position;
    a panel holding device for holding the liquid crystal panel at approximately a central part thereof and moving the liquid crystal panel so as to position the liquid crystal panel at said image pickup device such that the images of the panel marks can be picked up by said image pickup device;

a component holding device for
(i) holding and moving the component so as to position the component marks at the bonding height position such that the images of the component marks can be picked up by said image pickup device, and
(ii) mounting the component, while held by said component holding device, onto the liquid crystal panel while at the bonding height position; and a control device for controlling said panel holding device so as to position the panel marks at the bonding height position while negating a deflection amount at a side edge part of the liquid crystal panel generated as a result of being held by said panel holding device when the liquid crystal panel is to be positioned at said image pickup device, wherein the deflection amount is a value set for each side of the liquid crystal panel such that said control device is for controlling said panel holding device on a basis of the value set for a side of the liquid crystal panel on which are present the panel marks that are to have images thereof taken by said image pickup device.

11. The component mounting apparatus according to claim 10, wherein
said image pickup device comprises
(i) a light-passing stage onto which the liquid crystal panel is to be loaded to position the panel marks at the bonding height position when the images of the panel marks are to be picked up by said image pickup device, said light-passing stage functioning as a support stage during mounting of the component onto the liquid crystal panel, and
(ii) cameras, on a side of said light-passing stage that is opposite to a side of said light-passing stage on which the liquid crystal panel is located when the liquid crystal panel is loaded onto said light-passing stage, for picking up the images of the panel marks through said light-passing stage.

12. The component mounting apparatus according to claim 11, wherein
said cameras include
(i) a fixed camera for picking up an image of one of the panel marks or one of the component marks, and
(ii) a movable camera for picking up an image of a corresponding another of the panel marks or a corresponding another of the component marks, with said movable camera being movable so as to conform to an interval between the one of the panel marks or the one of the component marks and the corresponding another of the panel marks or the corresponding another of the component marks.

13. A component mounting apparatus for a liquid crystal panel, comprising:
an image pickup device for
(i) picking up images of panel marks on a liquid crystal panel onto which a component is to be mounted, while said panel marks are at a bonding height position in a thickness-direction of the liquid crystal panel when the component is to be mounted onto the liquid crystal panel, and
(ii) picking up images of component marks on the component while the component marks are at the bonding height position;
a panel holding device for holding the liquid crystal panel at approximately a central part thereof and moving the liquid crystal panel so as to position the liquid crystal panel at said image pickup device such that the images of the panel marks can be picked up by said image pickup device;

a component holding device for
(i) holding and moving the component so as to position the component marks at the bonding height position such that the images of the component marks can be picked up by said image pickup device, and
(ii) mounting the component, while held by said component holding device, onto the liquid crystal panel while at the bonding height position; and a control device for controlling said panel holding device so as to position the panel marks at the bonding height position while negating a deflection amount at a side edge part of the liquid crystal panel generated as a result of being held by said panel holding device when the liquid crystal panel is to be positioned at said image pickup device, wherein the deflection amount is a value set for a mount portion, of the liquid crystal panel, for the component such that said control device is for controlling said panel holding device on a basis of the value set for the mount portion.

14. The component mounting apparatus according to claim 13, wherein
said image pickup device comprises
(i) a light-passing stage onto which the liquid crystal panel is to be loaded to position the panel marks at the bonding height position when the images of the panel marks are to be picked up by said image pickup device, said light-passing stage functioning as a support stage during mounting of the component onto the liquid crystal panel, and
(ii) cameras, on a side of said light-passing stage that is opposite to a side of said light-passing stage on which the liquid crystal panel is located when the liquid crystal panel is loaded onto said light-passing stage, for picking up the images of the panel marks through said light-passing stage.

15. The component mounting apparatus according to claim 14, wherein
said cameras include
(i) a fixed camera for picking up an image of one of the panel marks or one of the component marks, and
(ii) a movable camera for picking up an image of a corresponding another of the panel marks or a corresponding another of the component marks, with said movable camera being movable so as to conform to an interval between the one of the panel marks or the one of the component marks and the corresponding another of the panel marks or the corresponding another of the component marks.

16. A component mounting apparatus for a liquid crystal panel, comprising:
an image pickup device for
(i) picking up images of panel marks on a liquid crystal panel onto which a component is to be mounted, while said panel marks are at a bonding height position in a thickness-direction of the liquid crystal panel when the component is to be mounted onto the liquid crystal panel, and
(ii) picking up images of component marks on the component while the component marks are at the bonding height position;
a panel holding device for holding the liquid crystal panel at approximately a central part thereof and moving the liquid crystal panel so as to position the liquid crystal panel at said image pickup device such that the images of the panel marks can be picked up by said image pickup device;

a component holding device for
(i) holding and moving the component so as to position the component marks at the bonding height position such that the images of the component marks can be picked up by said image pickup device, and
(ii) mounting the component, while held by said component holding device, onto the liquid crystal panel while at the bonding height position; and a control device for controlling said panel holding device so as to position the panel marks at the bonding height position while negating a deflection amount at a side edge part of the liquid crystal panel generated as a result of being held by said panel holding device when the liquid crystal panel is to be positioned at said image pickup device, wherein the deflection amount corresponds to a deflection amount of a mount portion, of the liquid crystal panel, for the component, and said component mounting apparatus further comprises:

a deflection detection device for detecting the deflection amount of the mount portion before the liquid crystal panel is positioned at said image pickup device, such that said control device is for controlling said panel holding device on a basis of the deflection amount as supplied from said deflection detection device.

17. The component mounting apparatus according to claim 16, wherein said image pickup device comprises
(i) a light-passing stage onto which the liquid crystal panel is to be loaded to position the panel marks at the bonding height position when the images of the panel marks are to be picked up by said image pickup device, said light-passing stage functioning as a support stage during mounting of the component onto the liquid crystal panel, and
(ii) cameras, on a side of said light-passing stage that is opposite to a side of said light-passing stage on which the liquid crystal panel is located when the liquid crystal panel is loaded onto said light-passing stage, for picking up the images of the panel marks through said light-passing stage.

18. The component mounting apparatus according to claim 17, wherein said cameras include
(i) a fixed camera for picking up an image of one of the panel marks or one of the component marks, and
(ii) a movable camera for picking up an image of a corresponding another of the panel marks or a corresponding another of the component marks, with said movable camera being movable so as to conform to an interval between the one of the panel marks or the one of the component marks and the corresponding another of the panel marks or the corresponding another of the component marks.

* * * * *

UNITED STATES PATENT AND TRADEMARK OFFICE
CERTIFICATE OF CORRECTION

PATENT NO. : 7,089,073 B2
APPLICATION NO. : 10/203661
DATED : August 8, 2006
INVENTOR(S) : Shinjiro Tsuji et al.

It is certified that error appears in the above-identified patent and that said Letters Patent is hereby corrected as shown below:

On the Front Page, Item (56)

On page 2, right column, under Foreign Patent Documents, add
--JP 04-352442 12/1992--.

Signed and Sealed this

Twenty-seventh Day of February, 2007

JON W. DUDAS
*Director of the United States Patent and Trademark Office*